(12) United States Patent  
Ravelosona et al.

(10) Patent No.: US 7,379,321 B2  
(45) Date of Patent: May 27, 2008

(54) MEMORY CELL AND PROGRAMMABLE LOGIC HAVING FERROMAGNETIC STRUCTURES EXHIBITING THE EXTRAORDINARY HALL EFFECT

(75) Inventors: Dafine Ravelosona, Villiers le Bacle (FR); Bruce David Terris, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 207 days.

(21) Appl. No.: 11/348,124

(22) Filed: Feb. 6, 2006

(65) Prior Publication Data

US 2006/0176620 A1 Aug. 10, 2006

Related U.S. Application Data

(60) Provisional application No. 60/650,292, filed on Feb. 4, 2005, provisional application No. 60/650,326, filed on Feb. 4, 2005.

(51) Int. Cl.  
*G11C 11/22* (2006.01)

(52) U.S. Cl. ............... 365/145; 365/158; 365/171; 365/173; 257/421; 257/30; 257/317

(58) Field of Classification Search .......... 365/145, 365/158, 171, 173; 257/421, 30, 317  
See application file for complete search history.

(56) References Cited

U.S. PATENT DOCUMENTS 3,233,228 A 2/1966 Kaspar 3,707,706 A 12/1972 Kefalas  
3,794,988 A 2/1974 Entner  
5,361,226 A 11/1994 Taguchi et al.

(Continued)

FOREIGN PATENT DOCUMENTS

DE 10144395 10/2002

(Continued)

OTHER PUBLICATIONS

Kokado, Satoshi, "A Theoretical Investigation Of Ferromagnetic Tunnel Junctions With 4-Valued Conductances", Dec. 1, 2003, pp. 1-16, Nanotechnology Research Institute, Tsukuba, Japan.

(Continued)

*Primary Examiner*—Connie C. Yoha  
(74) *Attorney, Agent, or Firm*—John J. Oskorep, Esq.; Rambod Nader

(57) ABSTRACT

Memory cell structures make use of the extraordinary Hall effect (EHE) for increased data storage capacity. A memory cell has a ferromagnetic structure which includes at least a first ferromagnetic layer, a second ferromagnetic layer, and a spacer layer in between the first and the second ferromagnetic layers. The first and the second ferromagnetic layers exhibit perpendicular magnetic anisotropy and have magnetic moments which are set in accordance with one of a plurality of magnetic orientation sets of the ferromagnetic structure, and the ferromagnetic structure exhibits one of a plurality of predetermined extraordinary Hall resistances $R_H$ in accordance with the magnetic orientation set. The extraordinary Hall resistance is exhibited between first and second ends of the ferromagnetic structure across a path which intersects a bias current path between third and fourth ends of the ferromagnetic structure.

23 Claims, 11 Drawing Sheets

U.S. PATENT DOCUMENTS

| | | | |
|---|---|---|---|
| 5,375,082 A | 12/1994 | Katti et al. | |
| 5,652,445 A | 7/1997 | Johnson | |
| 5,703,805 A | 12/1997 | Tehrani et al. | |
| 5,745,406 A | 4/1998 | Yamane et al. | |
| 5,930,164 A | 7/1999 | Zhu | |
| 6,140,838 A | 10/2000 | Johnson | |
| 6,147,922 A | 11/2000 | Hurst, Jr. et al. | |
| 6,249,453 B1 | 6/2001 | You et al. | |
| 6,288,565 B1 | 9/2001 | Johnson | |
| 6,316,965 B1 | 11/2001 | Jonker et al. | |
| 6,341,080 B1 | 1/2002 | Lienau et al. | |
| 6,387,476 B1 | 5/2002 | Iwasaki et al. | |
| 6,472,230 B2 | 10/2002 | Kimmel et al. | |
| 6,535,364 B1 | 3/2003 | Kumagai et al. | |
| 6,542,000 B1 | 4/2003 | Black et al. | |
| 6,590,806 B1 | 7/2003 | Bhattacharyya | |
| 6,654,279 B2 | 11/2003 | Nishimura | |
| 6,710,624 B2 | 3/2004 | Lienau | |
| 6,720,761 B1 * | 4/2004 | Doi et al. | 324/207.2 |
| 6,727,537 B2 | 4/2004 | Wunderlich | |
| 6,741,494 B2 | 5/2004 | Johnson | |
| 7,094,480 B2 * | 8/2006 | Nguyen Van Dau et al. | 428/811.5 |
| 2003/0227807 A1 | 12/2003 | Nakamura et al. | |
| 2003/0235072 A1 | 12/2003 | Kim et al. | |

FOREIGN PATENT DOCUMENTS

| | | |
|---|---|---|
| GB | 1158909 | 7/1969 |
| JP | 5135569 | 1/1993 |
| JP | 2000306376 | 2/2000 |

OTHER PUBLICATIONS

"Multilevel Memory Device Employing an Anomalous Hall Material", IBM Technical Disclosure Bulletin, Jan. 1980, pp. 3121.

* cited by examiner $R_{H1} \Rightarrow 00$ $R_{H2} \Rightarrow 01$ $R_{H3} \Rightarrow 10$ $R_{H4} \Rightarrow 11$

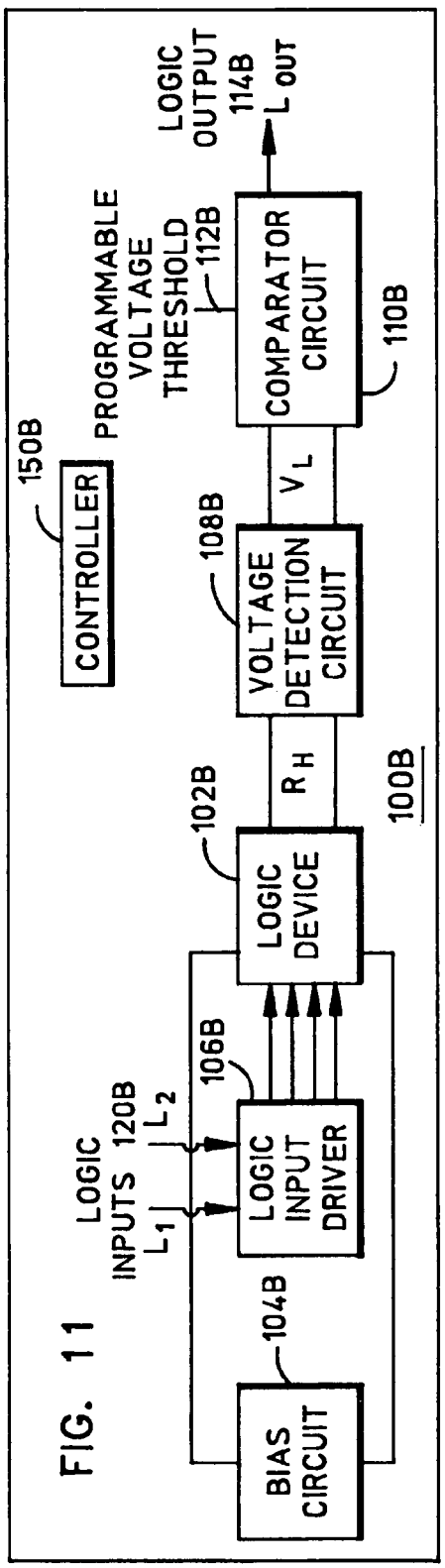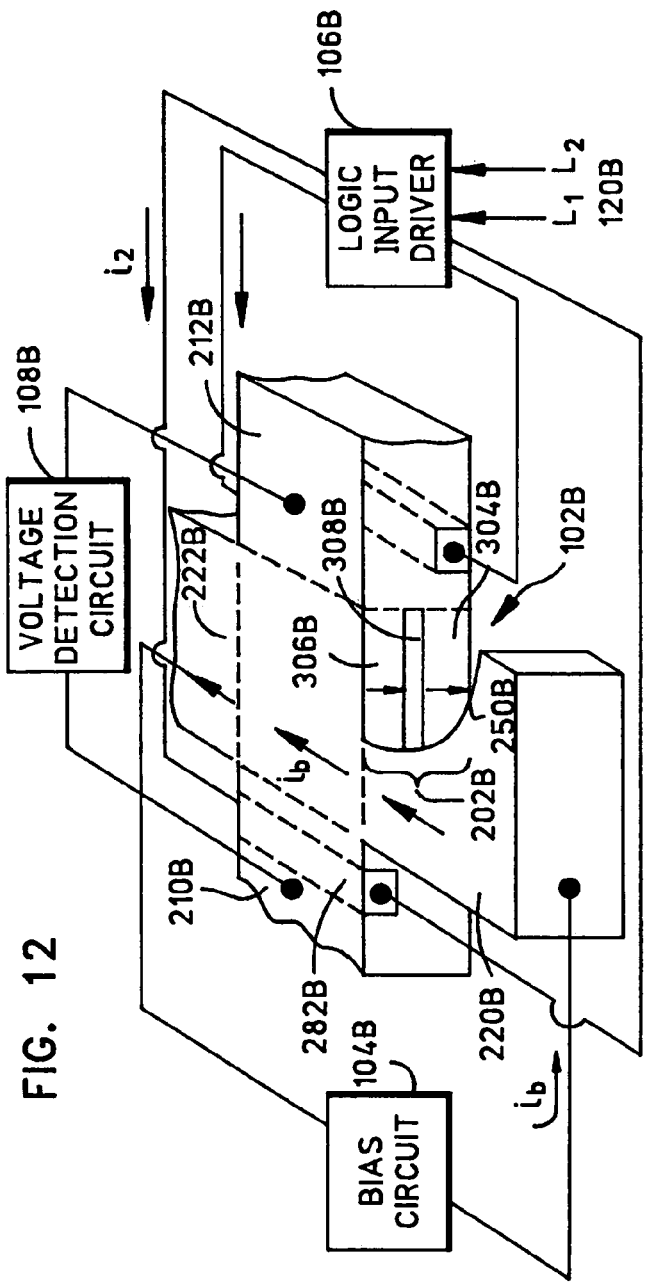

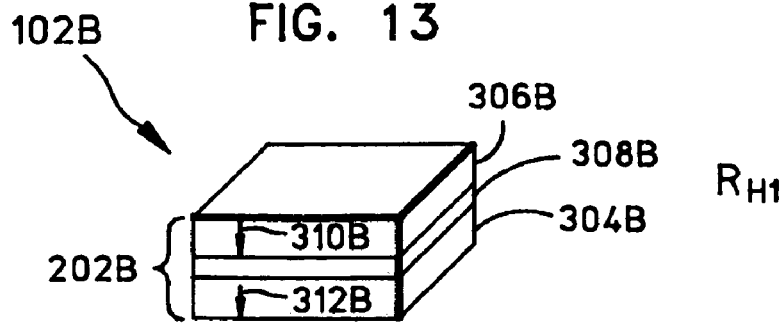
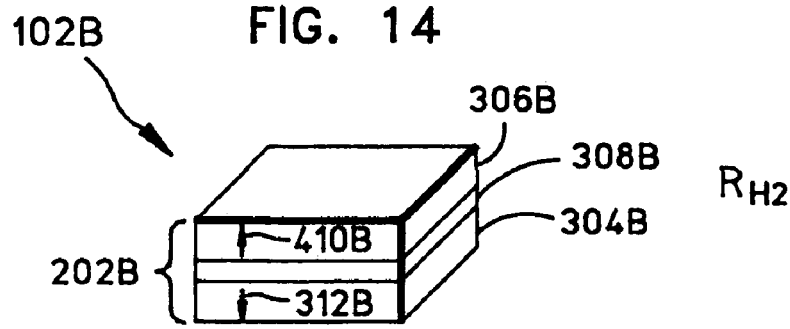
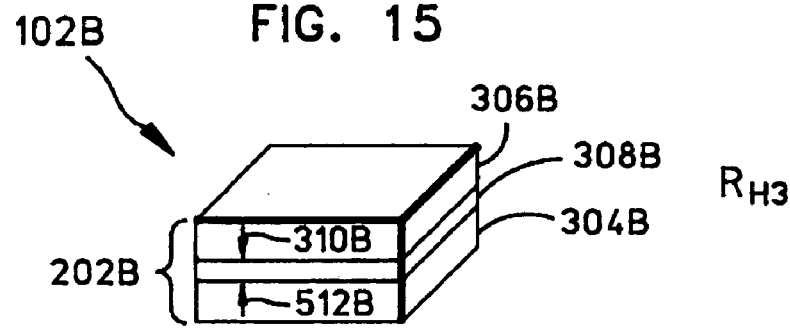
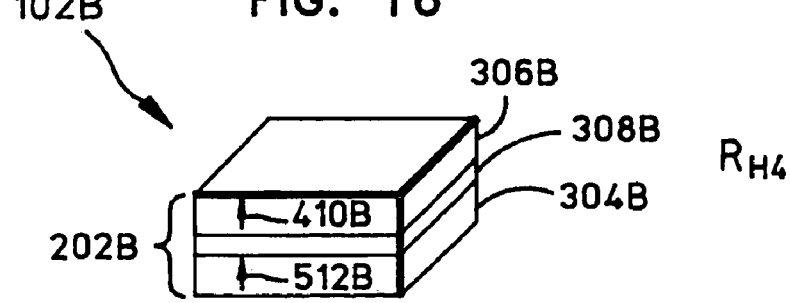

FIG. 18
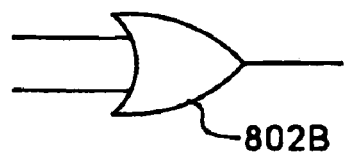
802B
FIG. 19
| $V_1$ | $V_2$ | $V_{OUT}$ |
|---|---|---|
| 0 | 0 | 0 |
| 0 | 1 | 1 |
| 1 | 0 | 1 |
| 1 | 1 | 1 |
900B
FIG. 20
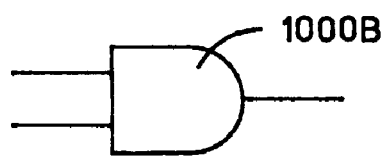
1000B
FIG. 21
| $V_1$ | $V_2$ | $V_{OUT}$ |
|---|---|---|
| 0 | 0 | 0 |
| 0 | 1 | 0 |
| 1 | 0 | 0 |
| 1 | 1 | 1 |
1100B

-PRIOR ART-

MEMORY CELL AND PROGRAMMABLE LOGIC HAVING FERROMAGNETIC STRUCTURES EXHIBITING THE EXTRAORDINARY HALL EFFECT

CROSS-REFERENCE TO RELATED APPLICATIONS

This patent application claims priority to a U.S. provisional patent application entitled "Magnetic Memory Cell Having Four States" having Ser. No. 60/650,292 and a filing date of 4 Feb. 2005, and to a U.S. provisional patent application entitled "Programmable Magnetic Logic Using A Magnetic Memory Cell Having Four Memory States" having Ser. No. 60/650,326 and a filing date of 4 Feb. 2005, both of which are hereby incorporated by reference herein.

BACKGROUND

1. Field of the Technology

This present application relates generally to memory devices such as magnetic random access memories (MRAMs), and more particularly to memory devices having ferromagnetic structures with perpendicular magnetic anisotropy which exhibit varying extraordinary Hall effect resistances, and also relates generally to programmable and reconfigurable logic devices having ferromagnetic structures with perpendicular magnetic anisotropy which exhibit the extraordinary Hall effect.

2. Description of the Related Art

Non-volatile magnetic random access memories (MRAMs) have been proposed as candidates to replace conventional dynamic random access memories (DRAMs) and hard disk drives. Such memory devices make use of GMR and tunneling magnetoresistance (TMR) sensing techniques. Currently-proposed MRAM devices utilize two magnetic layers which are magnetized in-plane so that variations in the GMR and/or TMR may be measured. The magnetic layers have magnetic orientations which are either in parallel or opposite each other, which create four magnetic states and give rise to two different GMR or TMR resistances associated with bits '0' and '1'. There is a need, however, for increased data storage capacity in these types of memory structures.

A conventional logic device may be included in a circuit called a field programmable gate array (FPGA), which is one type of programmable logic device (PLD). FPGAs use a grid of logic gates similar to that of an ordinary gate array, but the programming is performed by the customer, not by the manufacturer. FPGAs are typically programmed after being soldered down to a circuit board. In most larger FPGAs, the configuration is volatile and must be reloaded into the device whenever power is applied or different functionality is required.

Most any PLD includes a combination of one or more logic devices and memory devices. The memory device is used to store a pattern that was provided on the integrated circuit (IC) during programming. Most of the methods for storing data in the IC have been adapted for use in PLDs. These include silicon antifuses, electrically programmable read-only memory (EPROM) or EEPROM cells, Flash memory, and static random access memory (SRAM). An EPROM cell is a metal-oxide semiconductor transistor that may be switched on by trapping an electric charge permanently on its gate electrode. The charge remains for many years but may be removed by exposing the chip to strong ultraviolet light in a device called an EPROM eraser. Flash memory is non-volatile, retaining its contents even when the power is switched off. It may be erased and reprogrammed as required, which makes it useful for PLD memory. SRAM is a volatile type of memory, meaning that its contents are lost each time the power is switched off.

Referring ahead to FIG. 22, an SRAM device 1200B is shown to include a plurality of look-up tables (LUTs) of memory (such as an LUT 1202B) and a plurality of switches (such as a switch 1204B). SRAM-based PLDs are dynamic and adaptive, being programmable "on-the-fly" to new requirements as needed. SRAM-based PLDs must be programmed every time the circuit is switched on, which is usually performed automatically by another part of the circuit.

Proposals have been made to use magnetic devices (such as Giant Magnetoresistive (GMR) and tunneling magnetoresistance (TMR)-based structures) to replace conventional semiconductor logic devices. For example, proposals relating to non-volatile magnetic RAM (MRAM) are described in JP876674 to W. C. Black, U.S. Pat. No. 6,779,168, and U.S. Pat. No. 6,774,391. Proposed magnetic PLDs utilize two magnetic layers which are magnetized in-plane so that variations in the GMR and/or TMR may be measured. The magnetic layers have magnetic orientations which are either in parallel or opposite each other, which create four possible states but give rise to only two different GMR or TMR resistances associated with bits '0' and '1'. In addition, a writing process is necessary in order to program a different logic operation, which increases power dissipation for operation. Thus, what are also needed are structures for simpler logic devices and circuits to overcome the deficiencies of the prior art.

SUMMARY

Memory cell structures of the present application make use of the extraordinary Hall effect for increased data storage capacity. A memory cell has a ferromagnetic structure which includes at least a first ferromagnetic layer, a second ferromagnetic layer, and a spacer layer in between the first and the second ferromagnetic layers. The first and the second ferromagnetic layers have magnetic moments lying perpendicular to the plane of the layers (i.e. perpendicular magnetic anisotropy) which are set in accordance with one of a plurality of magnetic orientation sets of the ferromagnetic structure, and the ferromagnetic structure exhibits one of a plurality of predetermined extraordinary Hall resistances in accordance with the magnetic orientation set. The extraordinary Hall resistance is exhibited between first and second ends of the ferromagnetic structure across a path which intersects a bias current path between third and fourth ends of the ferromagnetic structure.

Thus, the memory cell has at least four memory states including a first memory state (e.g. [0, 0]) associated with a first extraordinary Hall resistance exhibited when the first and the second ferromagnetic layers are set to first magnetic orientations, a second memory state (e.g. [0, 1]) associated with a second extraordinary Hall resistance exhibited when the first ferromagnetic layer is set to the first magnetic orientation and the second ferromagnetic layer is set to a second magnetic orientation, a third memory state (e.g. [1, 0]) associated with a third extraordinary Hall resistance exhibited when the first ferromagnetic layer is set to the second magnetic orientation and the second ferromagnetic layer is set to the first magnetic orientation, and a fourth memory state (e.g. [1, 1]) associated with a fourth extraordinary Hall resistance exhibited when the first and the second ferromagnetic layers are set to the second magnetic orientations.

Programmable logic of the present application may also make use of the extraordinary Hall effect. In one illustrative example, a programmable logic circuit has a ferromagnetic structure, first and second logic input leads to the ferromagnetic structure, a bias current circuit, a voltage detection circuit, a comparator circuit, and a logic output. The ferromagnetic structure has at least a first ferromagnetic layer, a second ferromagnetic layer, and a spacer layer in between the first and the second ferromagnetic layers. The first and the second ferromagnetic layers exhibit perpendicular magnetic anisotropy. The first logic input lead is used for magnetically orienting the first ferromagnetic layer in one of a first magnetic orientation and a second magnetic orientation, and a second logic input lead is used for magnetically orienting the second ferromagnetic layer in one of the first magnetic orientation and the second magnetic orientation.

The bias current circuit is adapted to produce a bias current having a bias current path between first and second ends of the ferromagnetic structure. The voltage detection circuit is adapted to identify a voltage level which varies in accordance with each one of the plurality of predetermined extraordinary Hall resistances exhibited between third and fourth ends of the ferromagnetic structure across a path which intersects the bias current path. The comparator circuit is adapted to compare the voltage level from the voltage detection circuit with a threshold voltage. A logic output from the comparator circuit provides a first logic value when the voltage level is below the threshold voltage and a second logic value when the voltage level is above the threshold voltage. The threshold voltage may be varied to enable or program different types of logic, "on-the-fly" by the end user as needed.

BRIEF DESCRIPTION OF THE DRAWINGS

Other objects and advantages of the invention will become more apparent to those skilled in the art after considering the following detailed description in connection with the accompanying drawings.

FIG. 11 is a schematic block diagram of a programmable logic circuit of the present application;

FIG. 12 is an illustrative representation of a logic device in the programmable logic circuit of FIG. 11 which includes a ferromagnetic structure which exhibits a varying extraordinary Hall resistance;

FIGS. 13-16 are illustrations of the ferromagnetic structure of FIG. 12, showing that first and second ferromagnetic layers of the ferromagnetic structure have magnetic moments which may be set to one of a plurality of different magnetic orientation sets;

FIG. 18 is an illustrative representation of a logic gate which is an OR gate;

FIG. 19 is a truth table for the OR logic gate of FIG. 18;

FIG. 20 is an illustrative representation of a logic gate which is an AND gate;

FIG. 21 is a truth table for the AND logic gate of FIG. 20; and

DETAILED DESCRIPTION OF THE PREFERRED EMBODIMENTS

Figure 1:
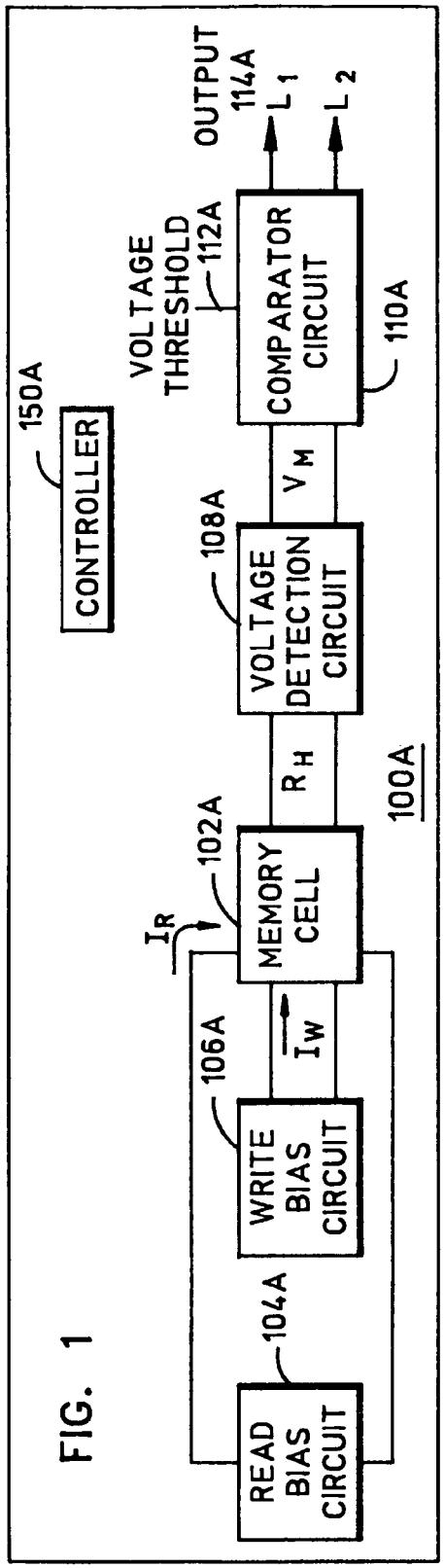
FIG. 1 is a schematic block diagram of a memory circuit of the present application.

Memory cell structures of the present application for magnetic random access memory (MRAM) arrays make use of the extraordinary Hall effect for increased data storage capacity. A memory cell has a ferromagnetic structure which includes at least a first ferromagnetic layer, a second ferromagnetic layer, and a spacer layer in between the first and the second ferromagnetic layers. The ferromagnetic layers exhibit perpendicular magnetic anisotropy. The first and the second ferromagnetic layers have magnetic moments lying perpendicular to the planes of the layers which are set in accordance with one of a plurality of magnetic orientation sets of the ferromagnetic structure, and the ferromagnetic structure exhibits one of a plurality of predetermined extraordinary Hall resistances ($R_H$) in accordance with the magnetic orientation set. The extraordinary Hall resistance is exhibited between first and second ends of the ferromagnetic structure across a path which intersects a bias current path between third and fourth ends of the ferromagnetic structure. Thus, the memory cell has at least four memory states including a first memory state associated with a first $R_H$ exhibited when the first and the second ferromagnetic layers are set to first magnetic orientations, a second memory state associated with a second $R_H$ exhibited when the first ferromagnetic layer is set to the first magnetic orientation and the second ferromagnetic layer is set to a second magnetic orientation, a third memory state associated with a third $R_H$ exhibited when the first ferromagnetic layer is set to the second magnetic orientation and the second ferromagnetic layer is set to the first magnetic orientation, and a fourth memory state associated with a fourth $R_H$ exhibited when the first and the second ferromagnetic layers are set to the second magnetic orientations.

Programmable logic of the present application may also make use of the extraordinary Hall effect. In one illustrative example, a programmable logic circuit includes a ferromagnetic structure, first and second logic input leads to the ferromagnetic structure, a bias current circuit, a voltage detection circuit, a comparator circuit, and a logic output. The ferromagnetic structure has at least a first ferromagnetic layer, a second ferromagnetic layer, and a spacer layer in between the first and the second ferromagnetic layers. The first and the second ferromagnetic layers exhibit perpendicular magnetic anisotropy. The first logic input lead is used for magnetically orienting the first ferromagnetic layer in one of a first magnetic orientation and a second magnetic orientation (i.e. the current flowing in the first logic input lead produces a magnetic field allowing to reverse the first ferromagnetic layer without reversing the second ferromagnetic layer.). The second logic input lead is used for magnetically orienting the second ferromagnetic layer in one of the first magnetic orientation and the second magnetic orientation (i.e. the current flowing in the second logic input lead produces a magnetic field allowing to reverse the second ferromagnetic layer without reversing the first ferromagnetic layer.). The bias current circuit is adapted to produce a bias current having a bias current path between first and second ends of the ferromagnetic structure. The voltage detection circuit is adapted to identify a voltage level which varies in accordance with each one of the plurality of predetermined extraordinary Hall resistances exhibited between third and fourth ends of the ferromagnetic structure across a path which intersects the bias current path. The comparator circuit is adapted to compare the voltage level from the voltage detection circuit with a threshold voltage. A logic output produces a first logic value when the voltage level is below the threshold voltage and a second logic value when the voltage level is above the threshold voltage. The threshold voltage may be varied to enable or program different types of logic, "on-the-fly" as needed as a field programmable device.

The following description is the best embodiment presently contemplated for carrying out the present invention. This description is made for the purpose of illustrating the general principles of the present invention and is not meant to limit the inventive concepts claimed herein.

Inventive Memory Cells. FIG. 1 is a schematic block diagram of a memory circuit 100A having a memory cell 102A which makes use of an extraordinary Hall effect for increased data storage capacity. Memory circuit 100A includes memory cell 102A, a read bias circuit 104A, a write bias circuit 106A, a voltage detection circuit 108A, and a comparator circuit 110A. Read bias circuit 104A is coupled to memory cell 102A for biasing purposes so that information may be read from the cell during a read operation. Write bias circuit 106A is coupled to memory cell 102A as well for causing information to be written to or saved within the cell during a write operation (this is true only when using spintorque techniques described later in relation to FIG. 9).

In the present embodiment, an extraordinary Hall resistance of memory cell 102A varies depending on a configured memory state of memory cell 102A. Voltage detection circuit 108A is adapted to detect a voltage level at outputs from memory cell 102A which varies in accordance with the varying extraordinary Hall resistance. The voltage level is produced at an output from voltage detection circuit 108A, which is provided for at an input of comparator circuit 110A. Comparator circuit 110A is adapted to produce a memory state output signal in accordance with the voltage level detected from voltage detection circuit 108A. More specifically, comparator circuit 110A is adapted to compare the voltage level to different predetermined voltage level thresholds 112A and produce different bit/state data associated with different voltages levels. Note that one or more controllers or processors 150A (e.g. a microcontroller or microprocessor) may be utilized for controlling the operation of any one or more of the components shown in FIG. 1.

Figure 2:
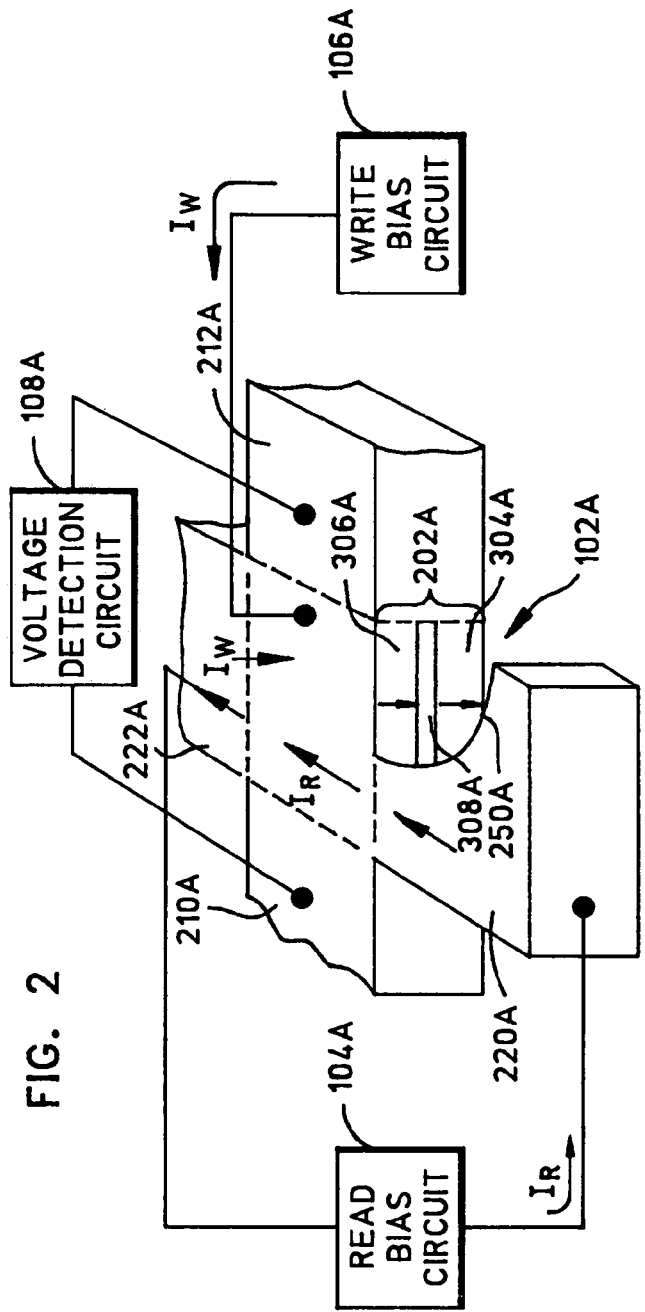
FIG. 2 is an illustrative representation of a memory cell in the memory circuit of FIG. 1 which includes a ferromagnetic structure with perpendicular magnetic anisotropy (PMA) which exhibits a varying extraordinary Hall resistance.

In FIG. 2, memory cell 102A is shown to have a ferromagnetic structure 202A revealed from a cutaway section 250A. Preferably, memory cell 102A is part of an array of similarly fabricated memory cells which may be part of a magnetic random access memory (MRAM) or MRAM array. Ferromagnetic structure 202A of memory cell 102A is made from multiple layers of materials and includes at least two ferromagnetic layers. In FIG. 2, ferromagnetic structure 202A is shown to have two ferromagnetic layers 304A and 306A and a spacer layer 308A in between the two ferromagnetic layers 304A and 306A. Ferromagnetic layers 304A and 306A may be made from, for example, Co, Co/Pt, Co/Pd, FePt, FePd, or CoNi, or a diluted magnetic semiconductor (DMS) or a half metal, all with perpendicular anisotropy. Spacer layer 308A may be made from a non-magnetic electrically conductive material, such as copper (Cu) or ruthenium (Ru). Alternatively, spacer layer 308A may be made from an electrically insulative material such as alumina ($Al_2O_3$) or other oxide, such as MgO. Although only a single stack of ferromagnetic/spacer/ferromagnetic layers is shown in the embodiment of FIG. 2, ferromagnetic structure may include two or more stacks of such layers.

Preferably, ferromagnetic layer 306A is a "soft" ferromagnetic layer and the second ferromagnetic layer 304A is a "hard" ferromagnetic layer relative to the soft ferromagnetic layer 306A, and both have perpendicular magnetic anisotropy (PMA). Ferromagnetic layer 306A is adapted to be magnetized in a desired magnetic orientation more easily (e.g. with use of a lesser field or current) than ferromagnetic layer 304A. To achieve ferromagnetic layers with different relative hardness/softness, different ferromagnetic materials (metallic or semiconductor, different anisotropy or different $M_s$), different seed layer materials, and/or different layer thicknesses may be utilized as is well known in the art. Due to these properties, there is a first configuration current or field that may be produced through ferromagnetic structure 202A that is sufficient to magnetically orient ferromagnetic layer 304A as well as magnetically orient ferromagnetic layer 306A, even after the first configuration current or field is withdrawn. In addition, there is a second configuration current or field less than the first configuration current or field that may be produced through ferromagnetic structure 202A that is sufficient to magnetically orient ferromagnetic layer 306A, even after the second configuration current or field is withdrawn, but not sufficient to magnetically orient ferromagnetic layer 304A which would remain unaffected.

Magnetic structure 202A has ends coupled to read biasing leads 220A and 222A which are coupled to read bias circuit 104A. In the present embodiment, read biasing leads 220A and 222A are integrally formed with or part of ferromagnetic structure 202A. Read biasing leads 220A and 222A are made from electrically conductive materials (e.g. Au or Cu), and may be made from the same electrically conductive ferromagnetic materials used in ferromagnetic layers 304A and 306A of ferromagnetic structure 202A (e.g. Co, Co/Pt, Co/Pd, FePt, FePd, or CoNi, or a diluted magnetic semiconductor (DMS) or a half metal). During each read operation from memory cell 102A, read bias circuit 104A is enabled such that a read bias current ($I_R$) is produced through ferromagnetic structure 202A between these ends. Note that the bias current path is in-plane with ferromagnetic layers 304A and 306A of ferromagnetic structure 202A.

Magnetic structure 202A has other ends coupled to measurement leads 210A and 212A which are coupled to voltage detection circuit 108A. In the present embodiment, measurement leads 210A and 212A are integrally formed with or part of ferromagnetic structure 202A. Measurement leads 210A and 212A are made from electrically conductive materials (e.g. Cu or Au), and may even be made from the same electrically conductive ferromagnetic materials used in the magnetic layers of ferromagnetic structure 202A (e.g. Co, Co/Pt, or Co/Ni). In particular, measurement leads 210A and 212A are formed with ferromagnetic structure 202A across a path which intersects the read bias current path between read biasing leads 220A and 222A. In the present embodiment, the path across which the extraordinary Hall resistance is exhibited is generally perpendicular to the path of the read bias current $I_R$.

Each magnetic layer of ferromagnetic structure 202A has a fixed magnetic moment in a fixed perpendicular magnetic orientation during normal, quiescent, static conditions. For example, in FIG. 2 ferromagnetic layers 304A and 306A are shown to have magnetic orientations which are set in the same (downwards) direction. Note, however, that the magnetic orientations of ferromagnetic layers 304A and 306A are also configurable so that may be changed during write operations to memory cell 102A.

Figure 3:
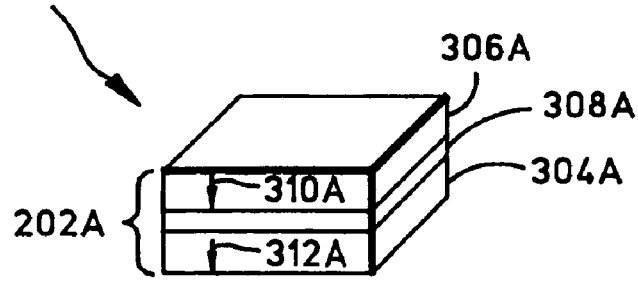
FIGS. 3-6 are illustrations of the ferromagnetic structure of FIG. 2, showing that first and second ferromagnetic layers of the structure have magnetic moments lying perpendicular to the plane of the layers which may be set to one of a plurality of different magnetic orientation sets.
Figure 4:
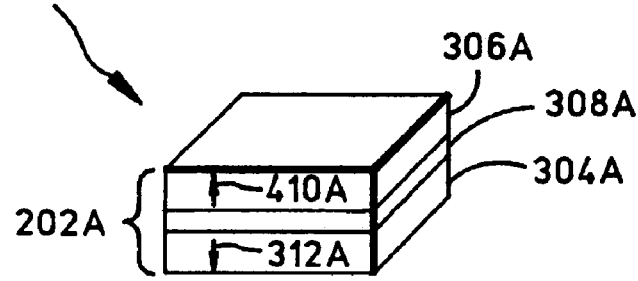
Figure 5:
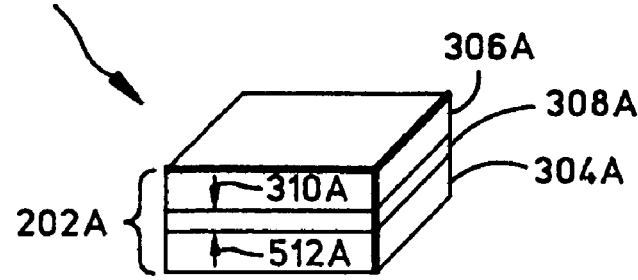
Figure 6:
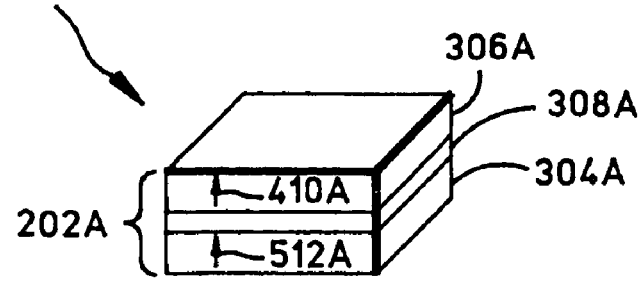

To illustrate, FIGS. 3-6 show a plurality of different magnetic orientation sets of ferromagnetic structure 202A. In the present embodiment, ferromagnetic structure 202A is shown to have four magnetic orientation sets. Note, however, ferromagnetic structure 202A may have more than four sets depending on the number of ferromagnetic layers being utilized. FIG. 3 shows a first magnetic orientation set of ferromagnetic structure 202A where ferromagnetic layer 304A has a magnetic orientation 312A and ferromagnetic layer 306A has a magnetic orientation 310A in the same (downwards) direction. FIG. 4 shows a second magnetic orientation set of ferromagnetic structure 202A where ferromagnetic layer 304A has magnetic orientation 312A but ferromagnetic layer 306A has a magnetic orientation 410A in a (upwards) direction opposite magnetic orientation 312A. FIG. 5 shows a third magnetic orientation set of ferromagnetic structure 202A where ferromagnetic layer 306A has magnetic orientation 310A but ferromagnetic layer 304A has a magnetic orientation 512A in a (upwards) direction opposite magnetic orientation 310A. Finally, FIG. 6 shows a fourth magnetic orientation set of ferromagnetic structure 202A where ferromagnetic layer 304A has magnetic orientation 512A and ferromagnetic layer 306A has magnetic orientation 410A in the same (upwards) direction. As particularly apparent in FIGS. 3-6, first and second ferromagnetic layers 304A and 306A have perpendicular magnetic anisotropy. Put another way, the magnetic orientations of ferromagnetic layers 304A and 306A are perpendicular to the planes defined by ferromagnetic layers 304A and 306A.

In thin films with perpendicular magnetic anisotropy, the Hall effect may be expressed as $$\rho_{xy} = R_0 H + R_S M_\perp$$

where $R_0$ is the normal Hall constant, H is the perpendicular applied field, $R_S$ the anomalous Hall constant, and $M_\perp$ the perpendicular magnetization. The first term is referred to as the "normal Hall effect," whereas the second term corresponds to the "extraordinary Hall effect" (EHE). In ferromagnetic thin films, it is typical that $R_S \gg R_0$ such that the extraordinary Hall effect is the dominant effect.

Ferromagnetic structure 202A exhibits one of a plurality of predetermined extraordinary Hall resistances in accordance with the magnetic orientation set of ferromagnetic structure 202A. As is well-known and documented, the extraordinary Hall effect (EHE) represented by the amplitude of $R_S$ in ferromagnetic structures is generally attributed to scatterings of iternant electrons in the presence of spin-orbit interactions. Put another way, the EHE arises from the asymmetric diffusion of conduction electrons, and is directly proportional to the perpendicular magnetization component of ferromagnetic structure 202A. The extraordinary Hall resistance is exhibited between measurement leads 210A and 212A of FIG. 2 between ends of ferromagnetic structure 202A across a path which intersects the bias current path (for bias current $I_R$) between other ends of ferromagnetic structure 202A.

Figure 7:
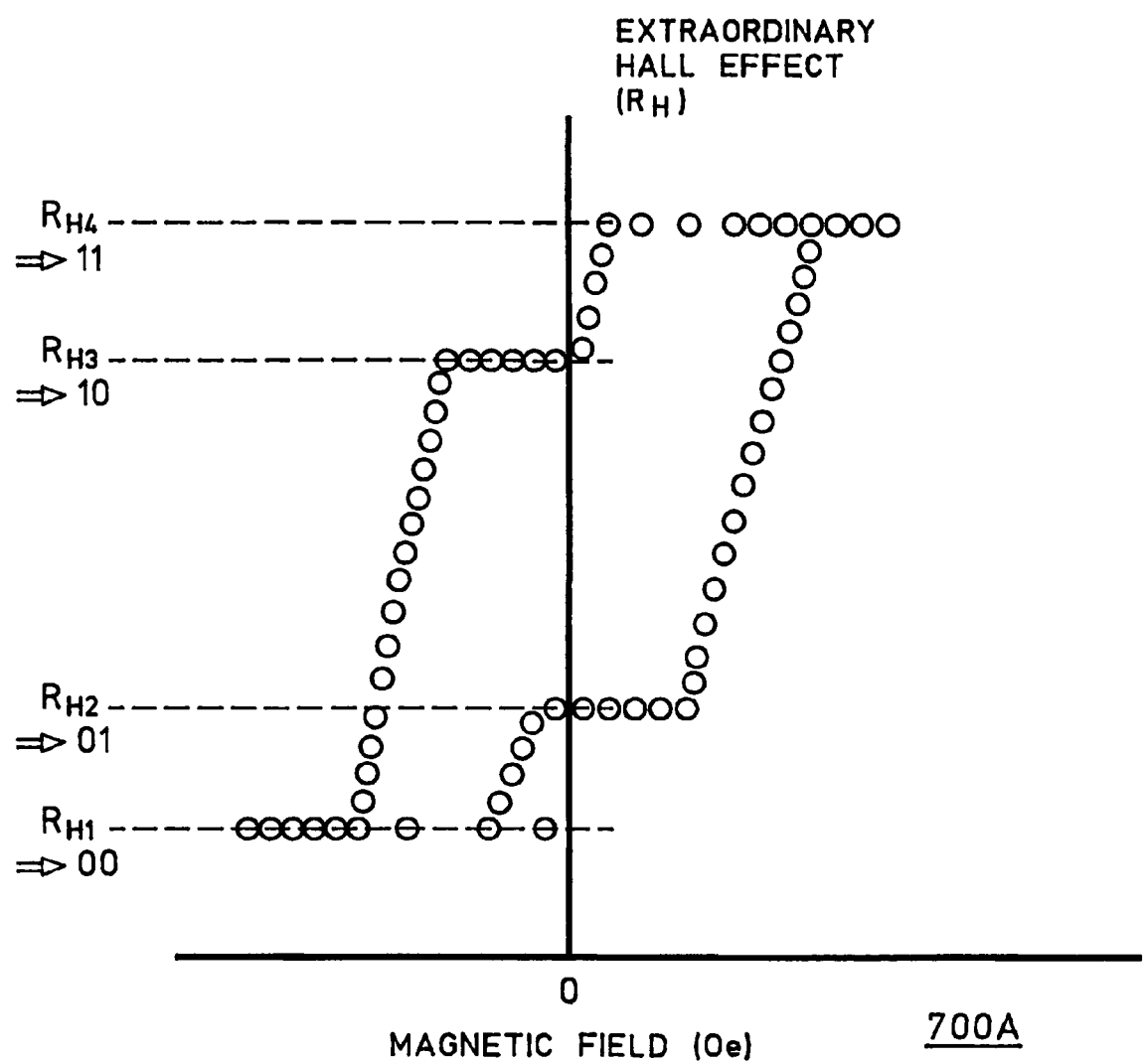
FIG. 7 is a graph of a Extraordinary Hall effect hysteresis loop of the ferromagnetic structure of FIGS. 2-6, showing variable extraordinary Hall resistance measurements of the ferromagnetic structure depending on which magnetic orientation set is provided for in the ferromagnetic structure.

FIG. 7 is a graph 700A of an EHE hysteresis loop of the ferromagnetic-structure of FIGS. 2-6, showing a variable extraordinary Hall resistance which is dependent on which magnetic orientation set is provided for in the ferromagnetic structure. The EHE hysteresis loop of FIG. 7 is particularly based on a ferromagnetic structure having a [Co(0.5 nm)Pt(1 nm)]$_4$/Co(0.5 nm)/Cu(6 nm)/Co(0.5 nm)/Pt(3 nm) multilayer structure. In the present embodiment of FIG. 7, the ferromagnetic structure is shown to exhibit exactly four different extraordinary Hall resistances $R_{H1}$, $R_{H2}$, $R_{H3}$, and $R_{H4}$. Note, however, the ferromagnetic structure may exhibit more than four such resistances depending on the number of ferromagnetic layers. More generally, there may be up to $2^N$ different resistances where N is the number of ferromagnetic layers in the memory cell, and where $N \geq 2$.

In the present embodiment represented by FIG. 7, a first extraordinary Hall resistance $R_{H1}$ is exhibited by the ferromagnetic structure in accordance with the first magnetic orientation set of FIG. 3; a second extraordinary Hall resistance $R_{H2}$ ($R_{H2} > R_{H1}$) is exhibited by the ferromagnetic structure in accordance with the second magnetic orientation set of FIG. 4; a third extraordinary Hall resistance $R_{H3}$ ($R_{H3} > R_{H2}$) is exhibited by the ferromagnetic structure in accordance with the third magnetic orientation set of FIG. 5; and a fourth extraordinary Hall resistance $R_{H4}$ ($R_{H4} > R_{H3}$) is exhibited by the ferromagnetic structure in accordance with the fourth magnetic orientation set of FIG. 6.

The different Hall effect resistances correspond to different voltage levels which are detectable by voltage detection circuit 108A of FIG. 1. The difference voltage levels correspond to different memory states of the memory cell. As there are four different extraordinary Hall resistances $R_{H1}$, $R_{H2}$, $R_{H3}$, and $R_{H4}$ exhibited in the present embodiment, there are four different detectable voltage levels and therefore four different memory states of the memory cell. These memory states may correspond to different bit data, for example, [0,0], [0,1], [1,0], and [1,1]. As an example, $R_{H1}$ may correspond to a first memory state or [0,0], $R_{H2}$ may correspond to a second memory state or [0,1], $R_{H3}$ may correspond to a third memory state or [1,0], and $R_{H4}$ may correspond to a fourth memory state or [1,1]. More generally, there may be up to $2^N$ memory states of the memory cell, where N is the number of ferromagnetic layers in the memory cell and N may be 2 or greater.

Referring back to FIG. 1, the detected voltage level is produced at an output from voltage detection circuit 108A (FIG. 1) and is provided for at an input of comparator circuit 110A. Comparator circuit 110A is adapted to produce one of the different memory states or bit data [0,0], [0,1], [1,0], and [1,1] depending on the voltage level detected from voltage detection circuit 108A. In the present embodiment, comparator circuit 110A is adapted to compare the voltage level to different predetermined voltage level thresholds 112A, so as to determine whether the voltage level falls into one of four different voltage ranges, and to thereby produce one of the different memory states or bit data [0,0], [0,1], [1,0], and [1,1] associated therewith. Note that, during the design phase, it is generally easy to configure and/or tune the voltage levels needed and voltage thresholds utilized in order to obtain large or maximum distinguishable results.

Figure 8:
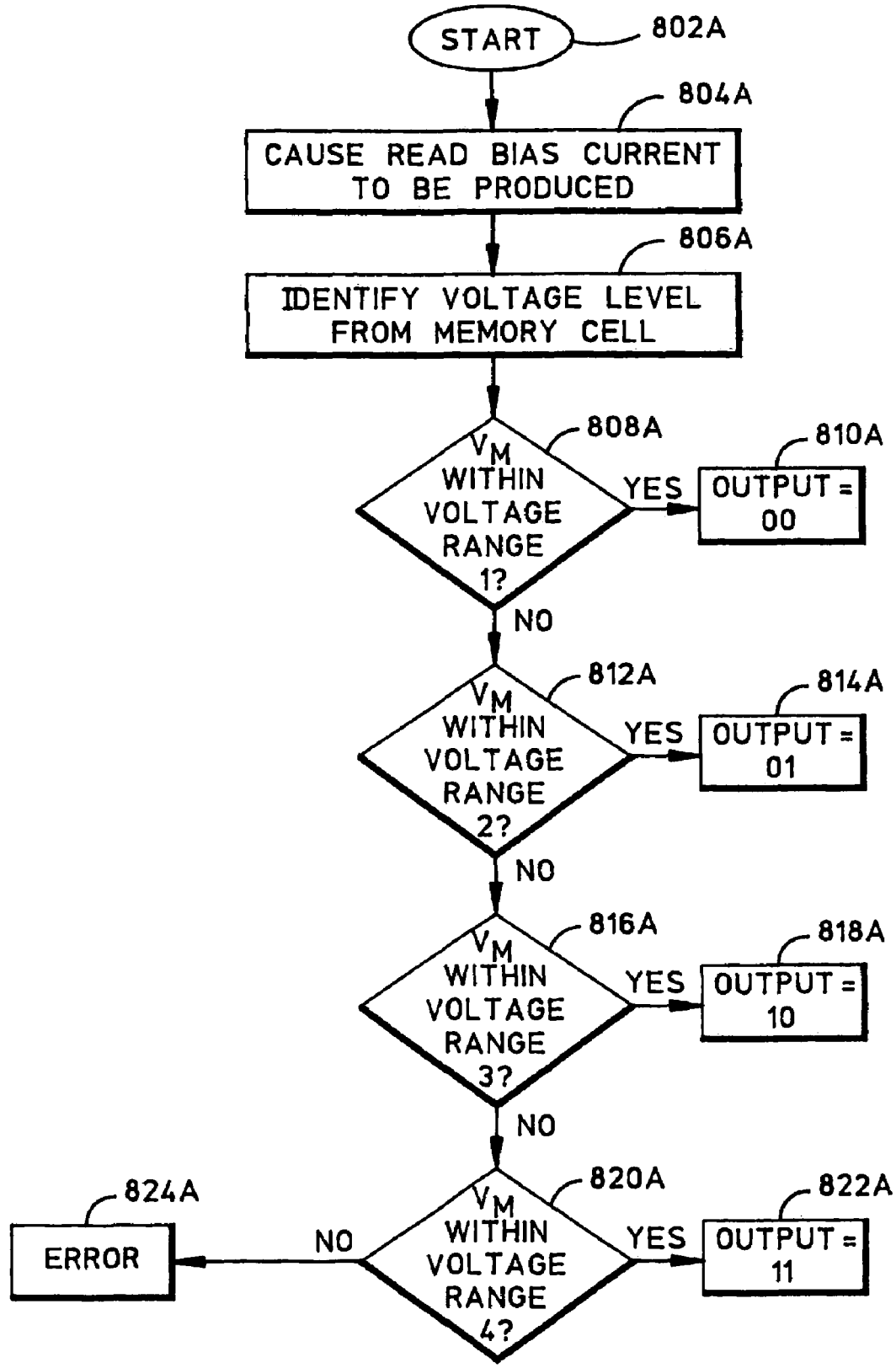
FIG. 8 is a flowchart which describes a method of reading from the memory cell of the present application.

FIG. 8 is a flowchart which describes a method of reading from the memory cell of the present application using the memory circuit of FIG. 1. The method of FIG. 8 may be employed in any electronic device which requires the storage of data, and be implemented with use of suitable electronic circuits or one or more controllers or processors of the electronic device. A computer program product of the present application may include a storage medium and computer instructions stored in the storage medium which are executable by one or more controllers or processors to help perform the method described herein.

The memory cell which is provided for use in the method of FIG. 8 has a ferromagnetic structure which includes at least a first ferromagnetic layer, a; second ferromagnetic layer, and a spacer layer in between the first and the second ferromagnetic layers. The first and the second ferromagnetic layers have magnetic moments lying in planes perpendicular to the layers with perpendicular magnetic anisotropy. These magnetic moments are set in accordance with one of a plurality of magnetic orientation sets of the ferromagnetic structure, and the ferromagnetic structure exhibits one of a plurality of predetermined extraordinary Hall resistances in accordance with the magnetic orientation set. The extraordinary Hall resistance is exhibited between first and second ends of the ferromagnetic structure across a path which intersects a bias current path between third and fourth ends of the ferromagnetic structure.

Beginning at a start block 802A of FIG. 8, a read bias current is provided through the ferromagnetic structure as described earlier in relation to FIG. 2 (step 804A of FIG. 8). This read bias current may be provided through use of a read bias circuit (e.g. see FIG. 1) and controlled by the controller/processor (e.g. see FIG. 1). While the read bias current is being produced, the ferromagnetic structure will exhibit one of the plurality of predetermined extraordinary Hall resistances since the first and the second ferromagnetic layers of the ferromagnetic structure have magnetic moments which are set in accordance with one of the plurality of magnetic orientation sets (e.g. see FIGS. 3-6). The extraordinary Hall resistance is translated into a voltage level which is detectable by a voltage detection circuit (e.g. see FIG. 1).

Thus, a voltage level is detected from the memory cell and identified (step 806A of FIG. 8). The voltage level is then compared to different predetermined voltage level thresholds, so as to determine whether the voltage level falls into one of four different voltage ranges. This may be performed with use of comparator circuit 110A of FIG. 1. If the voltage level falls within a first voltage range (step 808A of FIG. 8), then a first memory state is identified and first bit data such as [0,0] may be produced (step 810A of FIG. 8). If not, but rather the voltage level falls within a second voltage range which is greater than the first voltage range (step 812A of FIG. 8), then a second memory state is identified and second bit data such as [0,1] may be produced (step 814A of FIG. 8). If not, but rather the voltage falls within a third voltage range which is greater than the second voltage range (step 816A of FIG. 8), then a third memory state is identified and third bit data such as [1,0] may be produced (step 818A of FIG. 8). If not, but rather the voltage level falls within a fourth voltage range which is greater than the third voltage range (step 820A of FIG. 8), then a fourth memory state is identified and fourth bit data such as [1,1] may be produced (step 822A of FIG. 8). If not, but rather the voltage level fails to fall within any predetermined voltage range, then an error condition is noted (step 824A of FIG. 8).

As apparent, the method of reading a memory cell having a ferromagnetic structure which includes at least a first ferromagnetic layer, a second ferromagnetic layer, and a spacer layer in between the first and the second ferromagnetic layers, may involve the acts of causing a bias current to be produced between first and second ends of the ferromagnetic structure, identifying a voltage which varies in accordance with an extraordinary Hall resistance between third and fourth ends of the ferromagnetic structure across a path which intersects a bias current path of the bias current, and identifying one of a plurality of memory states of the memory cell based on the identified voltage.

Read operations for the inventive memory structures have been described above. On the other hand, memory cells of the present application may also be "configured" or written to for data storage purposes during write operations. Referring back to FIGS. 1-2, for purposes of configuring or writing to memory cell 102A, top and bottom ends of ferromagnetic structure may be coupled to write bias circuit 106A as shown. Write bias circuit 106A is adapted to produce a write bias current $I_W$ in a direction perpendicular to the planes defined by ferromagnetic layers 304A and 306A. Used as a "spin torque mechanism," the write bias current $I_W$ is sufficient to cause at least one of ferromagnetic layers 304A and 306A to be magnetically oriented in a direction of a desired magnetic orientation. This write bias current $I_W$ may be activated with use of a switch circuit, which may be or include a transistor. This switch circuit is switched on for a particular memory cell during the write operation, and switched off when not writing and during read operations. Write bias circuit 106A of FIG. 1 is controlled by the one or more controllers or processors and adapted to operate as follows.

Figure 9:
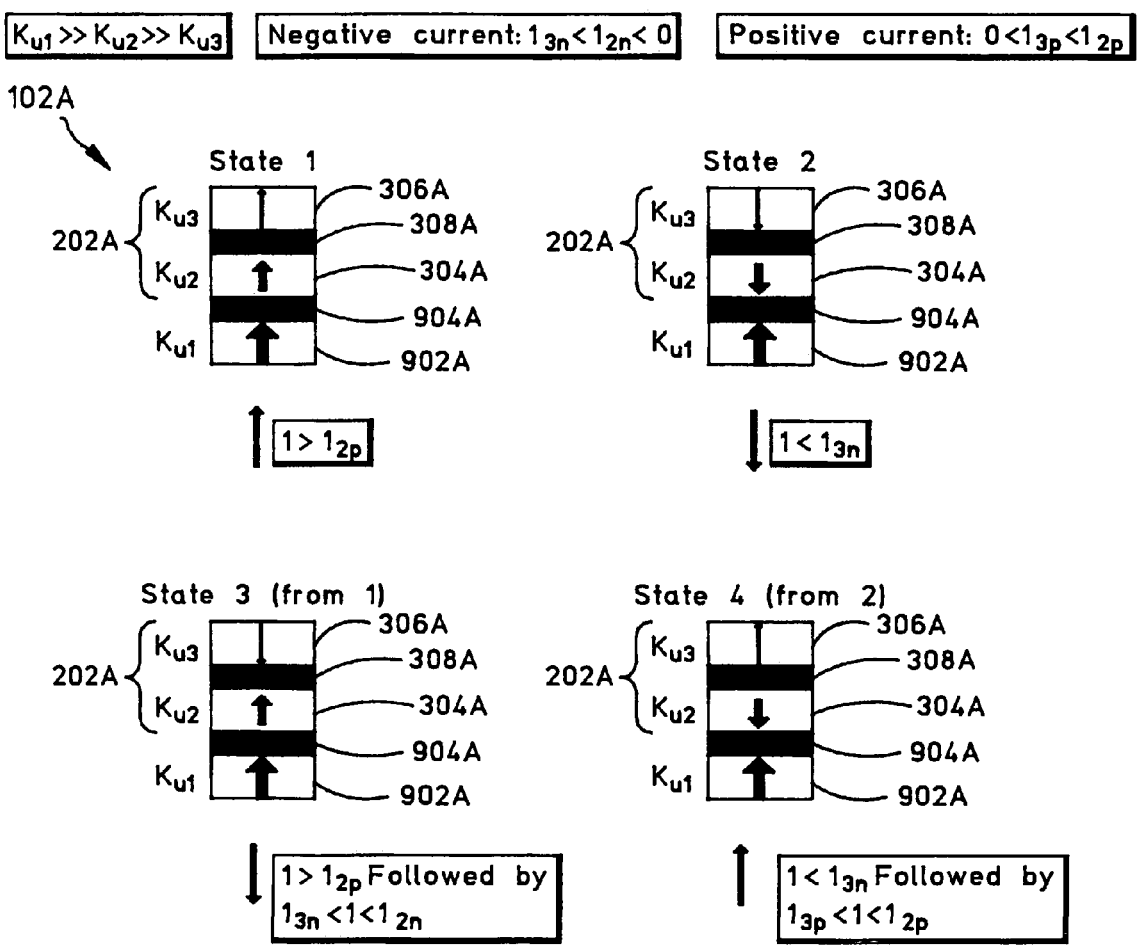
FIG. 9 are illustrations of the ferromagnetic structure in various states which may be set with use of spin torque techniques.

To further the discussion on the spin torque mechanism, FIG. 9 shows four cross-sectional views 900A of an alternative ferromagnetic structure 202A in four states which may be set using the spin torque techniques. The four states correspond to states 1, 2, 3, and 4. In order to use the spin torque effect for writing, ferromagnetic structure 202A of FIG. 9 includes a third ferromagnetic layer 902A having a perpendicular magnetic anisotropy that is stronger than each one of ferromagnetic layers 306A and 304A. Ferromagnetic layer 902A is separated from the rest of the structure by a spacer layer 904A. Ferromagnetic layer 902A has an anisotropy $K_{u1}$ and ferromagnetic layers 304A and 306A have anisotropies $K_{u2}$ and $K_{u3}$, respectively, such that $K_{u1} >> K_{u2} > K_{u3}$. The bottom arrows in FIG. 9 correspond to the flow direction of the electrons.

The anisotropy $K_{u1}$ of ferromagnetic layer 902A allows for the orientation of both ferromagnetic layers 304A and 306A layers in the same predetermined direction (state 1 when a positive current is used, and state 2 when a negative current is used). State 3 may be set only from state 1, and state 4 may be set only from state 2. There is a first (high) configuration current that may be produced through ferromagnetic structure 202A that is sufficient to magnetically orient ferromagnetic layer 304A as well as magnetically orient ferromagnetic layer 306A in the same direction (upwards for positive current, downwards for negative current) as indicated by states 1 and 2. On the other hand, there is a second configuration current less than the first configuration current that may be produced through ferromagnetic structure 202A that is sufficient to magnetically orient ferromagnetic layer 306A but not sufficient to magnetically orient ferromagnetic layer 304A which would remain unaffected.

To configure a first memory state ("state 1") of memory cell 102A, both ferromagnetic layers 304A and 306A are magnetically set in accordance with a first magnetic orientation by application of a first configuration current in a first (positive) direction. To configure a second memory state ("state 2") of memory cell 102A, both ferromagnetic layers 304A and 306A are magnetically set in accordance with a second magnetic orientation by application of a second configuration current in a second (negative) direction opposite the first direction. To configure a third memory state ("state 3") of memory cell 102A, ferromagnetic layer 304A is magnetically set in accordance with the first magnetic orientation by initial application of the first configuration current in the first (positive) direction (i.e. state 1) and ferromagnetic layer 306A is magnetically configured in accordance with the second magnetic orientation by subsequent application of a third configuration current in the second (negative) direction. To configure a fourth memory state ("state 4") of memory cell 102A, ferromagnetic layer 304A is magnetically set in accordance with the second magnetic orientation by initial application of the second configuration current in the second (negative) direction (state 2) and ferromagnetic layer 306A is magnetically set in accordance with the first magnetic orientation by subsequent application of a fourth configuration current in the first (positive) direction.

Figure 10:
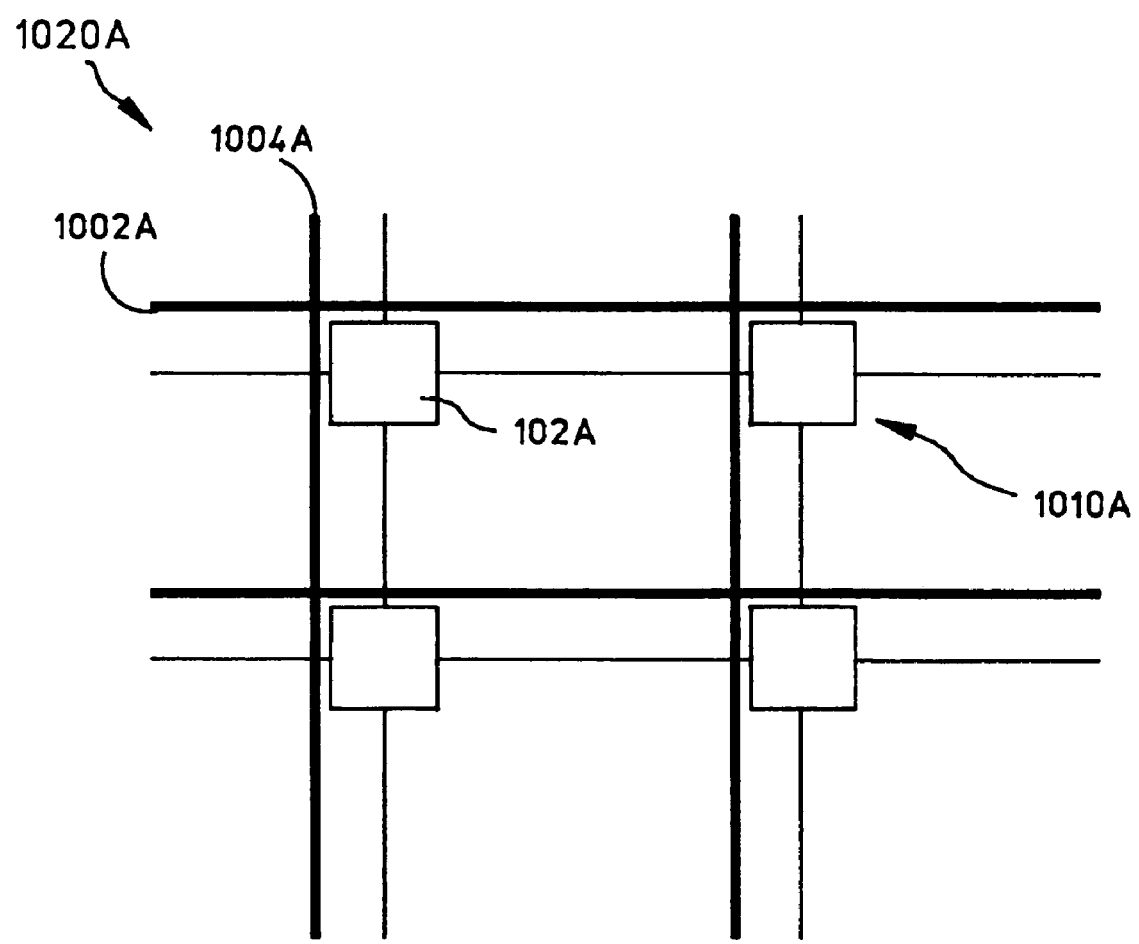
FIG. 10 is an alternate embodiment for a structure used for writing to the memory cell of the present application using a magnetic field.

As an alternative to the spin torque mechanism, ferromagnetic layers 304A and 306A may be magnetically oriented by producing a magnetic field adjacent to at least one of ferromagnetic layers 304A and 306A in a direction of a desired magnetic orientation. To illustrate, FIG. 10 is a partial top down view of an alternate embodiment for a structure used for writing to memory cells of the present application. In FIG. 10, an array of memory cells 1010A which includes memory cell 102A and a plurality of current configuration lines 1020A are shown. Current configuration lines 1020A include both horizontal and vertical current configuration lines. Each memory cell 1010A includes at least one pair of current configuration lines (i.e. one horizontal line and one vertical line) for writing purposes. For memory cell 102A, for example, a horizontal current configuration line 1002A and a vertical current configuration line 1004A which intersects horizontal current configuration line 1002A are adjacent memory cell 102A. By selecting a single horizontal line and a single vertical line, and causing a sufficient current to be produced through those lines, a single memory cell may be selected and written to. The "writing" occurs by a magnetic field which is produced in a direction of desired magnetic orientation by the currents adjacent a ferromagnetic layer of the memory cell. The magnetic field induces the setting of the magnetic orientation in the memory cell. The intersection of two lines is needed for setting the two ferromagnetic layers into one of the four states in each memory cell.

Final Comments Regarding Inventive-Memory Cells. Thus, a method of writing to a memory cell having a ferromagnetic structure which includes at least a first ferromagnetic layer, a second ferromagnetic layer, and a spacer layer in between the first and the second ferromagnetic layers, may involve the act of causing at least one of the first and the second ferromagnetic layers to be magnetically oriented so that the first and the second ferromagnetic layers have magnetic moments which are set in accordance with one of a plurality of magnetic orientation sets, where each magnetic orientation set is associated with one of a plurality of predetermined extraordinary Hall resistances exhibited between first and second ends of the ferromagnetic structure across a path which intersects a bias current path between third and fourth ends of the ferromagnetic structure.

As described herein, memory cell structures of the present application make use of the extraordinary Hall effect for increased areal densities. A memory cell of the present application has a ferromagnetic structure which includes at least a first ferromagnetic layer, a second ferromagnetic layer, and a spacer layer in between the first and the second ferromagnetic layers. The first and the second ferromagnetic layers have magnetic moments which are set in accordance with one of a plurality of magnetic orientation sets of the ferromagnetic structure, and the ferromagnetic structure exhibits one of a plurality of predetermined extraordinary Hall resistances in accordance with the magnetic orientation set. The extraordinary Hall resistance is exhibited between first and second ends of the ferromagnetic structure across a path which intersects a bias current path between third and fourth ends of the ferromagnetic structure. Thus, the memory cell has at least four memory states including a first memory state associated with a first $R_H$ exhibited when the first and the second ferromagnetic layers are set to first magnetic orientations, a second memory state associated with a second $R_H$ exhibited when the first ferromagnetic layer is set to the first magnetic orientation and the second ferromagnetic layer is set to a second magnetic orientation, a third memory state associated with a third $R_H$ exhibited when the first ferromagnetic layer is set to the second magnetic orientation and the second ferromagnetic layer is set to the first magnetic orientation, and a fourth memory state associated with a fourth $R_H$ exhibited when the first and the second ferromagnetic layers are set to the second magnetic orientations.

A memory circuit of the present application includes a memory cell comprising a ferromagnetic structure which includes at least a first ferromagnetic layer, a second ferromagnetic layer, and a spacer layer in between the first and the second ferromagnetic layers; a bias current circuit which is adapted to produce a bias current between first and second ends of the ferromagnetic structure; a voltage detection circuit which is adapted to identify a voltage which varies in accordance with each one of the plurality of predetermined extraordinary Hall resistances exhibited between third and fourth ends of the ferromagnetic structure across a path which intersects a bias current path; wherein each predetermined extraordinary Hall resistance is associated with a corresponding one of a plurality of magnetic orientation sets of the ferromagnetic structure. The magnetic orientations of the first and the second ferromagnetic layers are in directions normal to planes defined by the first and the second ferromagnetic layers. The plurality of predetermined extraordinary Hall resistances comprise a first extraordinary Hall resistance exhibited when the first and the second ferromagnetic layers are set to first magnetic orientations; a second extraordinary Hall resistance exhibited when the first ferromagnetic layer is set to the first magnetic orientation and the second ferromagnetic layer is set to a second magnetic orientation; a third extraordinary Hall resistance exhibited when the first ferromagnetic layer is set to the second magnetic orientation and the second ferromagnetic layer is set to the first magnetic orientation; and a fourth extraordinary Hall resistance exhibited when the first and the second ferromagnetic layers are set to the second magnetic orientations. The voltage detection circuit is further adapted to identify a first voltage associated with a first extraordinary Hall resistance exhibited when the first and the second ferromagnetic layers are set to first magnetic orientations, to identify a second voltage associated with a second extraordinary Hall resistance exhibited when the first ferromagnetic layer is set to the first magnetic orientation and the second ferromagnetic layer is set to a second magnetic orientation, to identify a third voltage associated with a third extraordinary Hall resistance exhibited when the first ferromagnetic layer is set to the second magnetic orientation and the second ferromagnetic layer is set to the first magnetic orientation, and to identify a fourth voltage associated with a fourth extraordinary Hall resistance exhibited when the first and the second ferromagnetic layers are set to the second magnetic orientations. The memory circuit exhibits a plurality of memory states including a first memory state associated with a first extraordinary Hall resistance exhibited when the first and the second ferromagnetic layers are set to first magnetic orientations; a second memory state associated with a second extraordinary Hall resistance exhibited when the first ferromagnetic layer is set to the first magnetic orientation and the second ferromagnetic layer is set to a second magnetic orientation; a third memory state associated with a third extraordinary Hall resistance exhibited when the first ferromagnetic layer is set to the second magnetic orientation and the second ferromagnetic layer is set to the first magnetic orientation; and a fourth memory state associated with a fourth extraordinary Hall resistance exhibited when the first and the second ferromagnetic layers are set to the second magnetic orientations.

A method of reading a memory cell of the present application includes the acts of providing a ferromagnetic structure which includes at least a first ferromagnetic layer, a second ferromagnetic layer, and a spacer layer in between the first and the second ferromagnetic layers; causing a bias current to be produced between first and second ends of the ferromagnetic structure; identifying a voltage which varies in accordance with an extraordinary Hall resistance between third and fourth ends of the ferromagnetic structure across a path which intersects a bias current path of the bias current; and identifying one of a plurality of memory states of the memory cell based on the identified voltage. The first and the second ferromagnetic layers are magnetically configurable in accordance with each one of a plurality of magnetic orientation sets of the ferromagnetic structure, and the extraordinary Hall resistance varies according to which one of the magnetic orientation sets is magnetically configured in the ferromagnetic structure. The plurality of memory states include at least a first memory state associated with a first extraordinary Hall resistance exhibited when the first and the second ferromagnetic layers are set to first magnetic orientations; a second memory state associated with a second extraordinary Hall resistance exhibited when the first ferromagnetic layer is set to the first magnetic orientation and the second ferromagnetic layer is set to a second magnetic orientation; a third memory state associated with a third extraordinary Hall resistance exhibited when the first ferromagnetic layer is set to the second magnetic orientation and the second ferromagnetic layer is set to the first magnetic orientation; and a fourth memory state associated with a fourth extraordinary Hall resistance exhibited when the first and the second ferromagnetic layers are set to the second magnetic orientations.

A method of writing to a memory cell of the present application includes the acts of providing a ferromagnetic structure which includes at least a first ferromagnetic layer, a second ferromagnetic layer, and a spacer layer in between the first and the second ferromagnetic layers; and causing at least one of the first and the second ferromagnetic layers to be magnetically oriented so that the first and the second ferromagnetic layers have magnetic moments which are set in accordance with one of a plurality of magnetic orientation sets, wherein each magnetic orientation set is associated with one of a plurality of predetermined extraordinary Hall resistances exhibited between first and second ends of the ferromagnetic structure across a path which intersects a bias current path between third and fourth ends of the ferromagnetic structure. A plurality of memory states of the memory cell include at least a first memory state associated with a first extraordinary Hall resistance exhibited when the first and the second ferromagnetic layers are set to first magnetic orientations; a second memory state associated with a second extraordinary Hall resistance exhibited when the first ferromagnetic layer is set to the first magnetic orientation and the second ferromagnetic layer is set to a second magnetic orientation; a third memory state associated with a third extraordinary Hall resistance exhibited when the first ferromagnetic layer is set to the second magnetic orientation and the second ferromagnetic layer is set to the first magnetic orientation; and a fourth memory state associated with a fourth extraordinary Hall resistance exhibited when the first and the second ferromagnetic layers are set to the second magnetic orientations. The act of causing at least one of the first and the second ferromagnetic layers to be magnetically oriented may comprise the further acts of: for a first memory state of the memory cell, causing both the first and the second ferromagnetic layers to be magnetically oriented in accordance with a first magnetic orientation, to thereby cause a first extraordinary Hall resistance to be exhibited between first and second ends of the ferromagnetic structure; for a second memory state of the memory cell, causing the first ferromagnetic layer to be magnetically oriented in accordance with the first magnetic orientation and the second ferromagnetic layer to be magnetically oriented in accordance with a second magnetic orientation, to thereby cause a second extraordinary Hall resistance to be exhibited between the first and the second ends of the ferromagnetic structure; for a third memory state of the memory cell, causing the first ferromagnetic layer to be magnetically oriented in accordance with the second magnetic orientation and the second ferromagnetic layer to be magnetically oriented in accordance with the first magnetic orientation, to thereby cause a third extraordinary Hall resistance to be exhibited between the first and the second ends of the ferromagnetic structure; and for a fourth memory state of the memory cell, causing both the first and the second ferromagnetic layers to be magnetically oriented in accordance with the second magnetic orientation, to thereby cause a fourth extraordinary Hall resistance to be exhibited between the first and the second ends of the ferromagnetic structure. The act of causing at least one of the first and the second ferromagnetic layers to be magnetically oriented may also comprise the further acts of causing a magnetic orientation current to be produced through planes of the at least one first and the second ferromagnetic layer in a direction of a desired magnetic orientation, or causing a magnetic field to be produced adjacent to the at least one first and second ferromagnetic layer in a direction of a desired magnetic orientation. A first configuration current line and a second configuration current line may be positioned adjacent the memory cell, and the act of causing at least one of the first and the second ferromagnetic layers to be magnetically oriented may comprise the further acts of causing a current to be produced through the first and the second configuration current lines, to thereby produce a magnetic field adjacent to the at least one first and second ferromagnetic layer in a direction of a desired magnetic orientation.

Inventive Programmable Logic. FIG. 11 is a schematic block diagram of a programmable logic circuit 100B having a logic device 102B which makes use of an extraordinary Hall effect (EHE). Logic circuit 100B includes logic device 102B, a bias circuit 104B, a logic input driver 106B, a voltage detection circuit 108B, and a comparator circuit 110B. Bias circuit 104B is coupled to logic device 102B for biasing purposes so that logic device 102B produces a desired logic output response as described further herein. Logic input driver 106 has at least two logic inputs 120B and is coupled to logic device 102B to convert logic input signals from logic inputs 120B into a suitable form so that logic device 102B responds appropriately as described further herein. Logic inputs 120B may be coupled to or part of logic input leads of logic circuit 100B.

In the present embodiment, an extraordinary Hall resistance of logic device 102B varies depending on the logic input signals from logic inputs 120B. Voltage detection circuit 108B is adapted to detect a voltage level at outputs from logic device 102B which varies in accordance with the varying extraordinary Hall resistance. The voltage level is produced at an output from voltage detection circuit 108B, which is provided for at an input of comparator circuit 110B. Comparator circuit 110B is adapted to produce a logic output signal in accordance with the voltage level detected from voltage detection circuit 108B. More specifically, comparator circuit 110B is adapted to compare the voltage level to at least one predetermined voltage level threshold 112B and produce a logic output signal (e.g. bit 0 or 1) associated with the voltage level. Note that one or more controllers or processors 150B (e.g. a microcontroller or microprocessor) may be utilized for controlling the operation of any one or more of the components shown in FIG. 11.

In FIG. 12, logic device 102B is shown to have a ferromagnetic structure 202B revealed from a cutaway section 250B. Ferromagnetic structure 202B of logic device 102B is made from multiple layers of materials and includes at least two ferromagnetic layers with perpendicular anisotropy. In FIG. 12, ferromagnetic structure 202B is shown to have two ferromagnetic layers 304B and 306B and a spacer layer 308B in between the two ferromagnetic layers 304B and 306B. Ferromagnetic layers 304B and 306B may be made from, for example, Co, Co/Pt, Co/Pd, FePt, FePd, or CoNi, or a diluted magnetic semiconductor (DMS) or a half metal, with perpendicular anisotropy. Spacer layer 308 may be made from a non-magnetic electrically conductive material, such as copper (Cu) or ruthenium (Ru). Alternatively, spacer layer 308B may be made from an electrically insulative material such as alumina ($Al_2O_3$) or other oxide, such as MgO. Although only a single stack of ferromagnetic/spacer/ferromagnetic layers is shown in the embodiment of FIG. 2, ferromagnetic structure may include two or more stacks of such layers. Preferably, logic device 102 is part of an array of similarly fabricated logic devices which may be part of a programmable logic array (PLA) or the like.

As further shown in FIG. 12, ferromagnetic structure 202B has ends coupled to biasing leads 220B and 222B which are coupled to bias circuit 104B. In the present embodiment, biasing leads 220B and 222B are integrally formed with or part of ferromagnetic structure 202B. Biasing leads 220B and 222B are made from electrically conductive materials (e.g. Cu or Au), and may be made from the same electrically conductive ferromagnetic materials used in ferromagnetic layers 304B and 306B of ferromagnetic structure 202B (e.g. Co, Co/Pt, Co/Pd, FePt, FePd, or CoNi, or a diluted magnetic semiconductor (DMS) or a half metal, with perpendicular anisotropy). During each operation from logic device 102B, bias circuit 104B is enabled such that a bias current ($i_b$) is produced through ferromagnetic structure 202B between these ends. Note that the bias current path is in-plane with ferromagnetic layers 304B and 306B of ferromagnetic structure 202B.

Magnetic structure 202B of FIG. 12 has other ends coupled to measurement leads 210B and 212B which are coupled to voltage detection circuit 108B. In the present embodiment, measurement leads 210B and 212B are integrally formed with or part of ferromagnetic structure 202B. Measurement leads 210B and 212B are made from electrically conductive materials (e.g. Cu or Au), and may even be made from the same electrically conductive ferromagnetic materials used in the magnetic layers of ferromagnetic structure 202B (e.g. Co, Co/Pt, Co/Ni). In particular, measurement leads 210B and 212B are formed with ferromagnetic structure 202B across a path which intersects the bias current path between biasing leads 220B and 222B. In the present embodiment, the path across which the extraordinary Hall resistance is exhibited is generally perpendicular to the path of the bias current $i_b$.

Each magnetic layer of ferromagnetic structure 202B has a magnetic moment which may be oriented (semi-permanently) in one of two (2) desired perpendicular magnetic orientations (i.e. upwards or downwards) during normal, quiescent, static conditions. For example, in FIG. 12 ferromagnetic layers 304B and 306B are shown to have magnetic orientations which are set in the same (downwards) direction. Note, however, that the magnetic orientations of ferromagnetic layers 304B and 306B are also changeable and may be reoriented in response to logic input signals 120B through logic input driver 120B. To achieve this, logic input driver 106B is coupled to logic device 102B to convert logic input signals from logic inputs 120B into a suitable form so that logic device 102B responds appropriately. The outputs from logic input driver 106B cause the magnetic orientations of ferromagnetic layers 304B to be set or changed for a desired logic output response.

For this purpose, logic device 102B also includes a plurality of orientation conductors such as a first orientation conductor 280B adjacent ferromagnetic layer 304B and a second orientation conductor 282B adjacent ferromagnetic layer 306B. As shown, each conductor 280B and 282B may be (integrally) formed as part of logic device 102B and positioned along (but not or not necessarily in contact with) its corresponding ferromagnetic layer. When logic input driver 106B receives a logic input signal 0 at L1, it produces a current $i_1$ in a first direction through first orientation conductor 280B to produce a magnetic field that sets or changes the magnetic orientation (e.g. upwards) of ferromagnetic layer 304B as appropriate; for a logic input signal 1 at L1, it produces the current $i_1$ in a second direction opposite the first direction through first orientation conductor 280B to produce a magnetic field that sets or changes the magnetic orientation (e.g. downwards) of ferromagnetic layer 304B as appropriate. Here, ferromagnetic layer 306B remains unaffected. Similarly, when logic input driver 106B receives a logic input signal 0 at L2, it produces a current $i_2$ in a first direction through second orientation conductor 282B to produce a magnetic field that sets or changes the magnetic orientation (e.g. upwards) of ferromagnetic layer 306B as appropriate; for a logic input signal 1 at L2, it produces the current $i_2$ in a second direction opposite the first direction through second orientation conductor 282B to produce a magnetic field that sets or changes the magnetic orientation (e.g. downwards) of ferromagnetic layer 306B as appropriate. Here, ferromagnetic layer 304B remains unaffected. Note that the spin transfer effect can also be used for logic input signals.

FIGS. 13-16 show a plurality of different magnetic orientation sets of ferromagnetic structure 202B which result from the logic input signals as described. In the present embodiment, ferromagnetic structure 202B is shown to have four magnetic orientation sets. Note, however, ferromagnetic structure 202B may have more than four sets depending on the design and detailed implementation. Note also that the number of magnetic orientation sets of ferromagnetic structure 202B may be equal to the number of maximum possible combinations of logic input signals at logic inputs 120B (e.g. $2^N$ where N is the number of logic inputs). Also apparent in FIGS. 13-16, first and second ferromagnetic layers 304B and 306B have perpendicular anisotropy. Put another way, the magnetic orientations of ferromagnetic layers 304B and 306B are perpendicular to the planes defined by ferromagnetic layers 304B and 306B.

Referring to FIG. 13 in particular, a first magnetic orientation set of ferromagnetic structure 202B where ferromagnetic layer 304B has a magnetic orientation 312B and ferromagnetic layer 306B has a magnetic orientation 310B in the same (downwards) direction is shown. In the present embodiment, the first magnetic orientation set of FIG. 13 corresponds to normal, quiescent, static conditions and/or corresponding to a first set of logic input signals (e.g. [0,0]. FIG. 14 shows a second magnetic orientation set of ferromagnetic structure 202B where ferromagnetic layer 304B has magnetic orientation 312B but ferromagnetic layer 306B has a magnetic orientation 410B in a (upwards) direction opposite magnetic orientation 312B. The second magnetic orientation set of FIG. 14 corresponds to a second set of logic input signals (e.g. [0,1]). FIG. 15 shows a third magnetic orientation set of ferromagnetic structure 202B where ferromagnetic layer 306B has magnetic orientation 310B but ferromagnetic layer 304B has a magnetic orientation 512B in a (upwards) direction opposite magnetic orientation 310B. The third magnetic orientation set of FIG. 15 corresponds to a third set of logic input signals (e.g [1,0]). Finally, FIG. 16 shows a fourth magnetic orientation set of ferromagnetic structure 202B where ferromagnetic layer 304B has magnetic orientation 512B and ferromagnetic layer 306B has magnetic orientation 410B in the same (upwards) direction. The fourth magnetic orientation set of FIG. 16 corresponds to a fourth set of logic input signals (e.g. [1,1]).

Ferromagnetic structure 202B exhibits one of a plurality of predetermined extraordinary Hall resistances in accordance with the magnetic orientation set of ferromagnetic structure 202B. In thin films with perpendicular magnetic anisotropy, the Hall effect may be expressed as $$\rho_{xy} = R_0 H + R_S M_\perp$$

where $R_0$ is the normal Hall constant, H is the perpendicular applied field, $R_S$ the anomalous Hall constant, and $M_\perp$ the perpendicular magnetization. The first term is referred to as the "normal Hall effect," whereas the second term corresponds to the "extraordinary Hall effect" (EHE). In ferromagnetic thin films, it is typical that $R_S >> R_0$ such that the extraordinary Hall effect is the dominant effect.

As is well-known and documented, the EHE represented by the amplitude of $R_S$ in ferromagnetic structures is generally attributed to scatterings of iternant electrons in the presence of spin-orbit interactions. Put another way, the EHE arises from the asymmetric diffusion of conduction electrons, and is directly proportional to the perpendicular magnetization component of ferromagnetic structure 202B. The extraordinary Hall resistance is exhibited between measurement leads 210B and 212B of FIG. 12 between ends of ferromagnetic structure 202B across a path which intersects the bias current path (for bias current $i_b$) between other ends of ferromagnetic structure 202B.

Figure 17:
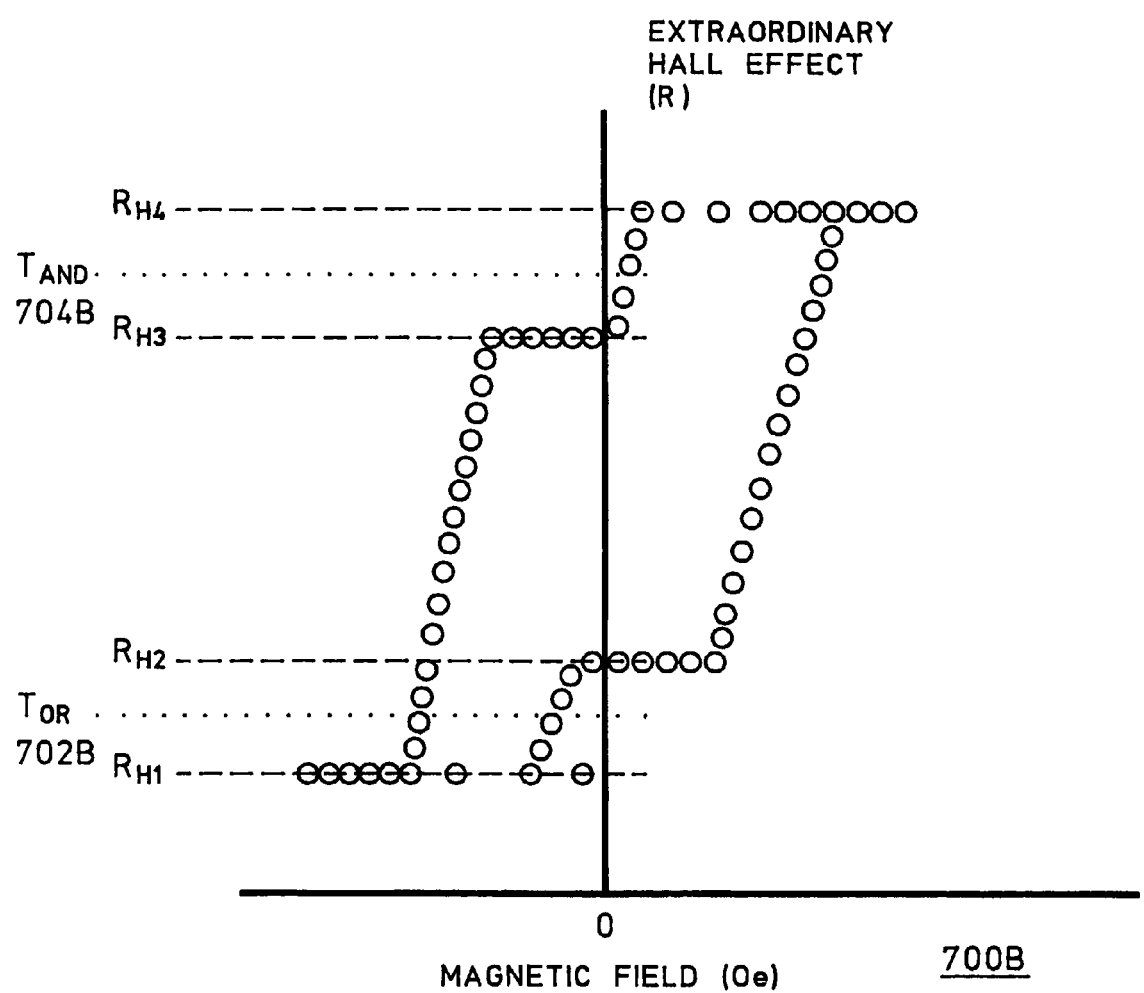
FIG. 17 is a graph of an Extraordinary Hall effect hysteresis loop of the ferromagnetic structure of FIGS. 12-16, showing variable extraordinary Hall resistance measurements of the ferromagnetic structure depending on which magnetic orientation set is provided for in the ferromagnetic structure.
Figure 22:
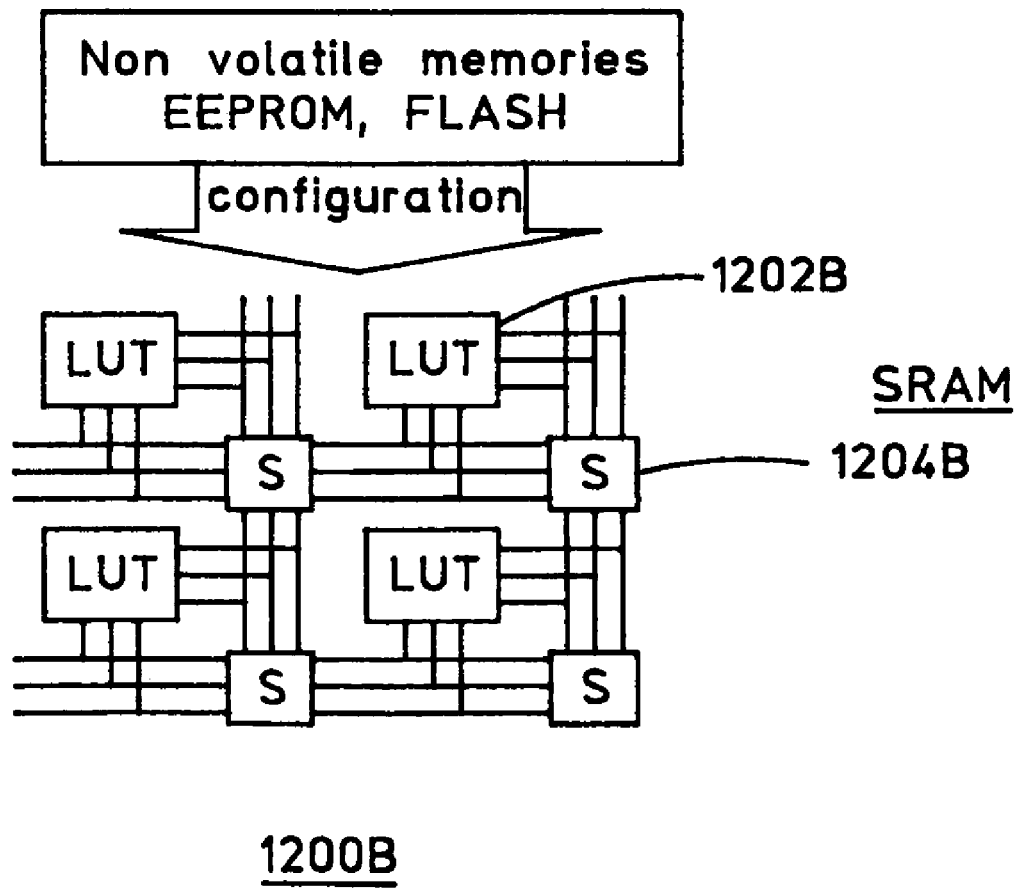
FIG. 22 is an illustration of a programmable field programmable gate array (FGPA) using static random access memory (SRAM) devices of the prior art.

FIG. 17 is a graph 700B of an Extraordinary Hall effect (EHE) hysteresis loop of the ferromagnetic structure of FIGS. 12-16, showing a variable extraordinary Hall resistance which is dependent on which magnetic orientation set is provided for in the ferromagnetic structure. The EHE hysteresis loop of FIG. 17 is particularly based on a ferromagnetic structure having a [Co(0.5 nm)Pt(1 nm)]$_4$/Co(0.5 nm)/Cu(6 nm)/Co(0.5 nm)/Pt(3 nm) multilayer structure. In the present embodiment of FIG. 17, the ferromagnetic structure is shown to exhibit exactly four different extraordinary Hall resistances $R_{H1}$, $R_{H2}$, $R_{H3}$, and $R_{H4}$. Note, however, the ferromagnetic structure may exhibit more than four such resistances depending on the design and detailed implementation. More generally, there may be up to $2^N$ different resistances where N is the number of ferromagnetic layers in the logic device (which may correspond to the number of logic inputs), where $N \geq 2$.

In the present embodiment represented by FIG. 17, a first extraordinary Hall resistance $R_{H1}$ is exhibited by the ferromagnetic structure in accordance with the first magnetic orientation set of FIG. 13; a second extraordinary Hall resistance $R_{H2}$ ($R_{H2} > R_{H1}$) is exhibited by the ferromagnetic structure in accordance with the second magnetic orientation set of FIG. 14; a third extraordinary Hall resistance $R_{H3}$ ($R_{H3} > R_{H2}$) is exhibited by the ferromagnetic structure in accordance with the third magnetic orientation set of FIG. 15; and a fourth extraordinary Hall resistance $R_{H4}$ ($R_{H4} > R_{H3}$) is exhibited by the ferromagnetic structure in accordance with the fourth magnetic orientation set of FIG. 16. The different extraordinary Hall effect resistances correspond to different voltage levels which are detectable by voltage detection circuit 108B of FIG. 11. The difference voltage levels correspond to different logic input signal sets. As there are four different extraordinary Hall resistances $R_{H1}$, $R_{H2}$, $R_{H3}$, and $R_{H4}$ exhibited in the present embodiment, there are four different detectable voltage levels corresponding to the four different logic input signal sets of the logic device. The logic input signals may correspond to different input bit data, for example, [0,0], [0,1], [1,0], and [1,1]. As an example, $R_{H1}$ may correspond to a first logic input signal set or [0,0] (e.g. see FIG. 13), $R_{H2}$ may correspond to a second logic input signal set or [0,1] (e.g. see FIG. 14), $R_{H3}$ may correspond to a third logic input signal set or [1,0] (e.g. see FIG. 15), and $R_{H4}$ may correspond to a fourth logic input signal set or [1,1] (e.g. see FIG. 16). Similar to the number of possible extraordinary Hall resistances, there may be up to $2^N$ logic input signal sets of the logic device, and N may 2 or greater.

Referring back to FIG. 11, the detected voltage level is produced at an output from voltage detection circuit 108B (FIG. 11) and is provided for at an input of comparator circuit 110B. Comparator circuit 110B is adapted to produce one of a plurality of logic output signals (e.g. 0 or 1) depending on the voltage level detected from voltage detection circuit 108B. In the present embodiment, comparator circuit 110B is adapted to compare the voltage level to at least one predetermined voltage level threshold 112B so as to detect whether the voltage level falls into one of four different predetermined voltage ranges. The plurality of predetermined voltage ranges for the logic device correspond to the different voltage levels detected in accordance with the different extraordinary Hall resistances exhibited by the ferromagnetic structure (e.g. $R_{H1}$, $R_{H2}$, $R_{H3}$, and $R_{H4}$ resistances shown in FIG. 17). In response, comparator circuit 110B produces one of the different logic output signals (e.g. 0 or 1) associated with the voltage range. During the design phase, one may configure and/or tune the voltage levels and voltage thresholds utilized in order to obtain large or maximum distinguishable results.

Also, as described in more detail below, voltage level threshold 112B may be varied to enable or program different types of logic for logic device 102B so that it is programmable and reconfigurable ("on-the-fly").

As an example, the logic circuit may be configured as an OR gate. A schematic representation of an OR gate 802B is shown in FIG. 18 which operates based on a truth table 900B shown in FIG. 19. The detected voltage level from the voltage detection circuit is compared to a voltage level threshold corresponding to an OR gate. Referring back to FIG. 17, the voltage level threshold corresponding to the OR gate may be a level threshold 702B ($T_{OR}$) as shown. The following description is based on the selection of a voltage level threshold which configures the logic device as an OR gate. If the voltage level falls within a first voltage range, then a first state is identified (e.g. logic input signal set [0,0]) and one of the logic output signals (e.g. logic output state or signal 0) may be selected and produced based on it. If not, but rather the voltage level falls within a second voltage range which is greater than the first voltage range, then a second state is identified (e.g. logic input signal set [0,1]) and one of the logic output signals (e.g. logic output state or signal 1) may be selected and produced based on it. If not, but rather the voltage falls within a third voltage range which is greater than the second voltage range, then a third state is identified (e.g. logic input signal set [1,0]) and one of the logic output signals (e.g. logic output state or signal 1) may be selected and produced based on it. If not, but rather the voltage level falls within a fourth voltage range which is greater than the third voltage range, then a fourth state is identified (e.g. logic input signal set [1,1]) and one of the logic output signals (e.g. logic output state or signal 1) may be selected and produced based on it. If not, but rather the voltage level fails to fall within any predetermined voltage range, then an error condition is identified. As apparent, the first voltage range includes (or is less than) the voltage level threshold $T_{OR}$ and the second, third, and fourth voltage ranges are greater than the voltage level threshold $T_{OR}$.

Again, one of more logic devices of the present application may be programmable and configured as any suitable logic gate or logic gate combination. The logic device of the present application may be a programmable logic device and may be incorporated in a PLA, a FPGA, or the like. The threshold voltage may be variably set during operation of the logic circuit, for use in a programmable and reconfigurable device.

Thus, in another illustrative example, logic circuit 100B of FIG. 11 is programmed (configured or variably reconfigured during operation) as an AND gate. A schematic representation of an AND gate 1000B is shown in FIG. 20 which operates based on a truth table 1100B shown in FIG. 21. The detected voltage level from the voltage detection circuit is compared to a voltage level threshold which corresponds to an AND gate. Referring back to FIG. 17, the voltage level threshold corresponding to the AND gate may be a level threshold 702B ($T_{AND}$) as shown. The following description is based on the selection of a voltage level threshold which configures the logic device as an AND gate. If the voltage level falls within a first voltage range, then the first state is identified (e.g. logic input signal set [0,0]) and one of the logic output signals (e.g. logic output state or signal 0) may be selected and produced based on it. If not, but rather the voltage level falls within a second voltage range which is greater than the first voltage range, then a second state is identified (e.g. logic input signal set [0,1]) and one of the logic output signals (e.g. logic output state or signal 0) may be selected and produced based on it. If not, but rather the voltage falls within a third voltage range which is greater than the second voltage range, then a third state is identified (e.g. logic input signal set [1,0]) and one of the logic output signals (e.g. logic output state or signal 0) may be selected and produced based on it. If not, but rather the voltage level falls within a fourth voltage range which is greater than the third voltage range, then a fourth state is identified (e.g. logic input signal set [1,1]) and one of the logic output signals (e.g. logic output state or signal 1) may be selected and produced based on it. If not, but rather the voltage level fails to fall within any predetermined voltage range, then an error condition is identified. As apparent, the first, second, and third voltage ranges are less than the voltage level threshold $T_{AND}$ and the fourth voltage range includes (or is greater than) the voltage level threshold $T_{AND}$.

Final Comments Regarding Inventive Programmable Logic. As described herein, a programmable logic circuit has a ferromagnetic structure, first and second logic input leads to the ferromagnetic structure, a bias current circuit, a voltage detection circuit, a comparator circuit, and a logic output. The ferromagnetic structure has at least a first ferromagnetic layer, a second ferromagnetic layer, and a spacer layer in between the first and the second ferromagnetic layers. The first and the second ferromagnetic layers exhibit perpendicular magnetic anisotropy. The first logic input lead is used for magnetically orienting the first ferromagnetic layer in one of a first magnetic orientation and a second magnetic orientation, and a second logic input lead is used for magnetically orienting the second ferromagnetic layer in one of the first magnetic orientation and the second magnetic orientation. The bias current circuit is adapted to produce a bias current having a bias current path between first and second ends of the ferromagnetic structure. The voltage detection circuit is adapted to identify a voltage level which varies in accordance with each one of the plurality of predetermined extraordinary Hall resistances exhibited between third and fourth ends of the ferromagnetic structure across a path which intersects the bias current path. The comparator circuit is adapted to compare the voltage level from the voltage detection circuit with a threshold voltage. A logic output provides a first logic value when the voltage level is below the threshold voltage and a second logic value when the voltage level is above the threshold voltage. The threshold voltage may be varied to enable or program different types of logic for the logic circuit.

A programmable logic device of the present application has a ferromagnetic structure having at least a first ferromagnetic layer, a second ferromagnetic layer, and a spacer layer in between the first and the second ferromagnetic layers, where the first and the second ferromagnetic layers exhibit perpendicular magnetic anisotropy; a first logic input lead to the ferromagnetic structure for magnetically orienting the first ferromagnetic layer in one of a first magnetic orientation and a second magnetic orientation; a second logic input lead to the ferromagnetic structure for magnetically orienting the second ferromagnetic layer in one of the first magnetic orientation and the second magnetic orientation; where the ferromagnetic structure is adapted to exhibit, in response to input signals at the first and the second logic input leads, at least four predetermined extraordinary Hall resistances between first and second ends of the ferromagnetic structure. The at least four predetermined extraordinary Hall resistances between the first and second ends of the ferromagnetic structure may be across a path which intersects a bias current path between third and fourth ends of the ferromagnetic structure. A first orientation conductor may be positioned adjacent the first ferromagnetic layer and responsive to a first logic input signal at the first logic input lead, and a second orientation conductor may be positioned adjacent the second ferromagnetic layer and responsive to a second logic input signal at the second logic input lead. The first orientation conductor may be adapted to receive a current for inducing a magnetic field adjacent the first ferromagnetic layer, and the second orientation conductor may be adapted to receive a current for inducing a magnetic field adjacent the second ferromagnetic layer.

Note that, for both the memory and logic devices, it may be desirable to achieve output voltages in the millivolt (mV) range using low current density (e.g. $<10^7$ A/cm$^2$). Preferably, the EHE is increased accordingly so as to be compatible with most any device application. It is to be understood that the above is merely a description of preferred embodiments of the invention and that various changes, alterations, and variations may be made without departing from the true spirit and scope of the invention as set for in the appended claims. For example, the programmable logic device and circuit may be configurable to any suitable logic gate or logic gate combination, such as any suitable OR-type gate (OR, NOR, XOR, etc.), AND-type gate (AND, NAND, etc.). Few if any of the terms in the specification and claims have been given any special particular meaning different from the plain language meaning to those ordinarily skilled in the art, and therefore the specification is not to be used to define terms in an unduly narrow sense.

What is claimed is:

1. A memory cell comprising:
   a ferromagnetic structure having at least a first ferromagnetic layer, a second ferromagnetic layer, and a spacer layer in between the first and the second ferromagnetic layers;
   the first and the second ferromagnetic layers exhibiting perpendicular magnetic anisotropy with magnetic moments which are set in accordance with one of a plurality of magnetic orientation sets of the ferromagnetic structure;
   the ferromagnetic structure being adapted to exhibit one of a plurality of predetermined extraordinary Hall resistances between first and second ends of the ferromagnetic structure across a path which intersects a bias current path between third and fourth ends of the ferromagnetic structure; and
   each predetermined extraordinary Hall resistance associated with a corresponding one of the plurality of magnetic orientation sets.

2. The memory cell of claim 1, wherein at least four predetermined extraordinary Hall resistances are exhibited between the first and the second ends of the ferromagnetic structure.

3. The memory cell of claim 1, wherein the plurality of predetermined extraordinary Hall resistances comprise:
   a first extraordinary Hall resistance exhibited when the first and the second ferromagnetic layers are set to first magnetic orientations;
   a second extraordinary Hall resistance exhibited when the first ferromagnetic layer is set to the first magnetic orientation and the second ferromagnetic layer is set to a second magnetic orientation;
   a third extraordinary Hall resistance exhibited when the first ferromagnetic layer is set to the second magnetic orientation and the second ferromagnetic layer is set to the first magnetic orientation; and
   a fourth extraordinary Hall resistance exhibited when the first and the second ferromagnetic layers are set to the second magnetic orientations.

4. The memory cell of claim 1, wherein the first ferromagnetic layer has a magnetic orientation configurable to one of a first magnetic orientation and a second magnetic orientation, and wherein the second ferromagnetic layer has a magnetic orientation configurable to one of the first magnetic orientation and the second magnetic orientation.

5. The memory cell of claim 1, which exhibits a plurality of memory states comprising:
   a first memory state associated with a first extraordinary Hall resistance exhibited when the first and the second ferromagnetic layers are set to first magnetic orientations;
   a second memory state associated with a second extraordinary Hall resistance exhibited when the first ferromagnetic layer is set to the first magnetic orientation and the second ferromagnetic layer is set to a second magnetic orientation;
   a third memory state associated with a third extraordinary Hall resistance exhibited when the first ferromagnetic layer is set to the second magnetic orientation and the second ferromagnetic layer is set to the first magnetic orientation; and
   a fourth memory state associated with a fourth extraordinary Hall resistance exhibited when the first and the second ferromagnetic layers are set to the second magnetic orientations.

6. The memory cell of claim 1, wherein the first ferromagnetic layer comprises a soft ferromagnetic layer and the second ferromagnetic layer comprises a hard ferromagnetic layer relative to the soft ferromagnetic layer.

7. The memory cell of claim 1, wherein the spacer layer comprises a non-magnetic electrically conductive spacer layer.

8. The memory cell of claim 1, wherein the path across which the extraordinary Hall resistance is exhibited is perpendicular to the bias current path.

9. The memory cell of claim 1, which is part of a magnetic random access memory (MRAM) array.

10. The memory cell of claim 1, wherein the first and the second ferromagnetic layers are made of at least one of Co, Co/Pt, Co/Pd, FePt, FePd, and CoNi, with perpendicular anisotropy.

11. The memory cell of claim 1, wherein the first and the second ferromagnetic layers are made of at least one of a diluted magnetic semiconductor (DMS) and a half metal.

12. The memory cell of claim 1, wherein the ferromagnetic structure further includes a third ferromagnetic layer and another spacer layer in between the first and the third ferromagnetic layers for writing to the memory cell using spin transfer.

13. A logic device, comprising:
    a ferromagnetic structure having at least a first ferromagnetic layer, a second ferromagnetic layer, and a spacer layer in between the first and the second ferromagnetic layers;

the first and the second ferromagnetic layers exhibiting perpendicular magnetic anisotropy;

a first logic input lead to the ferromagnetic structure for magnetically orienting the first ferromagnetic layer in one of a first magnetic orientation and a second magnetic orientation;

a second logic input lead to the ferromagnetic structure for magnetically orienting the second ferromagnetic layer in one of the first magnetic orientation and the second magnetic orientation; and the ferromagnetic structure being adapted to exhibit, in response to input signals at the first and the second logic input leads, one of a plurality of predetermined extraordinary Hall resistances between first and second ends of the ferromagnetic structure across a path which intersects a bias current path between third and fourth ends of the ferromagnetic structure.

14. The logic device of claim 13, wherein the plurality of predetermined extraordinary Hall resistances comprise:

a first extraordinary Hall resistance exhibited when the first and the second ferromagnetic layers are oriented in the first magnetic orientations;

a second extraordinary Hall resistance exhibited when the first ferromagnetic layer is oriented in the first magnetic orientation and the second ferromagnetic layer is oriented in a second magnetic orientation;

a third extraordinary Hall resistance exhibited when the first ferromagnetic layer is oriented in the second magnetic orientation and the second ferromagnetic layer is oriented in the first magnetic orientation; and a fourth extraordinary Hall resistance exhibited when the first and the second ferromagnetic layers are oriented in the second magnetic orientations.

15. The logic device of claim 13, which exhibits a plurality of logic output states comprising:

a first logic output state associated with a first extraordinary Hall resistance exhibited when the first and the second ferromagnetic layers are oriented in the first magnetic orientations;

a second logic output state associated with a second extraordinary Hall resistance exhibited when the first ferromagnetic layer is oriented in the first magnetic orientation and the second ferromagnetic layer is oriented in a second magnetic orientation;

a third logic output state associated with a third extraordinary Hall resistance exhibited when the first ferromagnetic layer is oriented in the second magnetic orientation and the second ferromagnetic layer is oriented in the first magnetic orientation; and a fourth logic output state associated with a fourth extraordinary Hall resistance exhibited when the first and the second ferromagnetic layers are oriented in to the second magnetic orientations.

16. The logic device of claim 13, comprising one of an OR-type gate and an AND-type gate.

17. The logic device of claim 13, which forms part of an OR-type gate and further comprises:

a first logic output state of '0' associated with a first extraordinary Hall resistance exhibited when the first and the second ferromagnetic layers are oriented in the first magnetic orientations;

a second logic output state of '1' associated with a second extraordinary Hall resistance exhibited when the first ferromagnetic layer is oriented in the first magnetic orientation and the second ferromagnetic layer is oriented in a second magnetic orientation;

a third logic output state of '1' associated with a third extraordinary Hall resistance exhibited when the first ferromagnetic layer is oriented in the second magnetic orientation and the second ferromagnetic layer is oriented in the first magnetic orientation; and a fourth logic output state of '1' associated with a fourth extraordinary Hall resistance exhibited when the first and the second ferromagnetic layers are oriented in to the second magnetic orientations.

18. The logic device of claim 13, which forms part of an AND-type gate and further comprises:

a first logic output state of '0' associated with a first extraordinary Hall resistance exhibited when the first and the second ferromagnetic layers are oriented in the first magnetic orientations;

a second logic output state of '0' associated with a second extraordinary Hall resistance exhibited when the first ferromagnetic layer is oriented in the first magnetic orientation and the second ferromagnetic layer is oriented in a second magnetic orientation;

a third logic output state of '0' associated with a third extraordinary Hall resistance exhibited when the first ferromagnetic layer is oriented in the second magnetic orientation and the second ferromagnetic layer is oriented in the first magnetic orientation; and a fourth logic output state of '1' associated with a fourth extraordinary Hall resistance exhibited when the first and the second ferromagnetic layers are oriented in to the second magnetic orientations.

19. The logic device of claim 13, wherein the path across which the extraordinary Hall resistance is exhibited is perpendicular to the bias current path.

20. The logic device of claim 13, wherein the bias current path is in-plane with the first and the second ferromagnetic layers of the ferromagnetic structure.

21. The logic device of claim 13, comprising a programmable logic device.

22. The logic device claim 13, wherein the first and the second ferromagnetic layers are made of at least one of Co, Co/Pt, Co/Pd, FePt, FePd, and CoNi, with perpendicular anisotropy.

23. The logic device of claim 13, wherein the first and the second ferromagnetic layers are made of at least one of a diluted magnetic semiconductor (DMS) and a half metal.

* * * * *